(12) United States Patent
Tian et al.

(10) Patent No.: US 12,520,641 B2
(45) Date of Patent: Jan. 6, 2026

(54) LIGHT-EMITTING SUBSTRATE, METHOD FOR MANUFACTURING THE SAME, AND DISPLAY DEVICE

(71) Applicants: HEFEI BOE RUISHENG TECHNOLOGY CO., LTD., Anhui (CN); BOE TECHNOLOGY GROUP CO., LTD., Beijing (CN)

(72) Inventors: Jian Tian, Beijing (CN); Jie Lei, Beijing (CN); Zouming Xu, Beijing (CN); Jie Wang, Beijing (CN); Jianying Zhang, Beijing (CN); Chunjian Liu, Beijing (CN); Jiawei Xu, Beijing (CN); Tsungchieh Kuo, Beijing (CN); Xintao Wu, Beijing (CN)

(73) Assignees: HEFEI BOE RUISHENG TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 18/040,505

(22) PCT Filed: Oct. 27, 2021

(86) PCT No.: PCT/CN2021/126805
§ 371 (c)(1),
(2) Date: Feb. 3, 2023

(87) PCT Pub. No.: WO2023/070389
PCT Pub. Date: May 4, 2023

(65) Prior Publication Data
US 2024/0258478 A1 Aug. 1, 2024

(51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/0364* (2025.01)

(58) Field of Classification Search
CPC .............. H10H 20/857; H10H 20/0364; H01L 25/0753
See application file for complete search history.

(56) References Cited

U.S. PATENT DOCUMENTS

2006/0157855 A1* 7/2006 Kamakura ........... H10K 59/131
257/758
2010/0244280 A1 9/2010 Shimizu et al.
(Continued)

FOREIGN PATENT DOCUMENTS

CN 102169941 A 8/2011
CN 108321281 A 7/2018
(Continued)

OTHER PUBLICATIONS

Partial Supplementary European Search Report corresponding to European Application No. 21961758.6 (Aug. 13, 2024).
(Continued)

*Primary Examiner* — Christine A Enad
(74) *Attorney, Agent, or Firm* — Myers Bigel, P.A.

(57) ABSTRACT

The present disclosure provides a light-emitting substrate, a method for manufacturing the same, and a display device. The light-emitting substrate includes: a substrate including a light-emitting region; a first conductor on the substrate and at least in the light-emitting region, the first conductor extending along a first direction in the light-emitting region; a second conductor on the first conductor and arranged in the light-emitting region, the second conductor including a first connecting portion; and a first insulator within the light-emitting region. The first connecting portion extends along a second direction, an orthographic projection of the first connecting portion on the substrate at least partially overlaps
(Continued)

with an orthographic projection of the first conductor on the substrate to constitute an overlapping region. The first insulator is only between the first connecting portion and the first conductor, the overlapping region is within an orthographic projection of the first insulator on the substrate.

26 Claims, 10 Drawing Sheets

(56) References Cited

U.S. PATENT DOCUMENTS

| | | | |
|---|---|---|---|
| 2017/0092691 A1* | 3/2017 | Tso | H10H 29/142 |
| 2018/0090037 A1* | 3/2018 | Tso | G09F 9/301 |
| 2019/0165076 A1 | 5/2019 | Lee et al. | |
| 2019/0387616 A1 | 12/2019 | Hsieh et al. | |
| 2020/0152826 A1 | 5/2020 | Lee et al. | |
| 2020/0201115 A1 | 6/2020 | Ko | |
| 2021/0366329 A1* | 11/2021 | Lee | G01N 21/956 |

FOREIGN PATENT DOCUMENTS

| | | |
|---|---|---|
| CN | 108807356 A | 11/2018 |
| CN | 110047891 A | 7/2019 |
| CN | 111051975 A | 4/2020 |
| CN | 112505964 A | 3/2021 |
| CN | 112739012 A | 4/2021 |
| CN | 112882295 A | 6/2021 |
| CN | 110120395 B | 7/2021 |
| CN | 113097248 A | 7/2021 |
| CN | 113097370 A | 7/2021 |
| CN | 113130463 A | 7/2021 |
| CN | 113219736 A | 8/2021 |
| CN | 113497079 A | 10/2021 |
| JP | S6343896 B2 | 9/1988 |
| JP | 2010192499 A | 9/2010 |
| KR | 20200081762 A | 7/2020 |
| KR | 102149426 B1 | 8/2020 |
| TW | 202139419 A | 10/2021 |
| WO | 2007145596 A1 | 12/2007 |

OTHER PUBLICATIONS

Office Action for TW111140842 mailed Sep. 20, 2023, with translation, 12 pages.
Extended European Search Report corresponding to European Application No. 21961758.6 (21 pages) (Dec. 17, 2024).
First Office Action of Chinese Patent Application No. 202180003109.9 (Foreign Text, 7 Pages, English Translation Thereof, 5 Pages) (Dec. 9, 2024).
International Search Report and Written Opinion for PCT/CN2021/126805 mailed Aug. 4, 2022, with translation of the International Search Report, 14 pages.
Novelty Report with translation, dated Aug. 5, 2021, 8 pages.

* cited by examiner

LIGHT-EMITTING SUBSTRATE, METHOD FOR MANUFACTURING THE SAME, AND DISPLAY DEVICE

RELATED APPLICATIONS

The present application is a 35 U.S.C. 371 national stage application of PCT International Application No. PCT/CN2021/126805 filed on Oct. 27, 2021, the entire disclosure of which is incorporated herein by reference.

TECHNICAL FIELD

The present disclosure relates to the field of optical technology, and in particular, to a light-emitting substrate and a method for manufacturing the same, and a display device comprising the light-emitting substrate.

BACKGROUND

With the continuous development of display technology, users have put forward higher and higher requirements for the reliability of display devices. Display devices are generally divided into two categories: liquid crystal display devices and organic light-emitting diode display devices. The liquid crystal display device is widely used due to the advantages of thinness, good shock resistance, wide viewing angle, and high contrast. The liquid crystal display device generally comprises a display panel and a backlight, and the backlight is usually disposed on a non-display side of the display panel to provide a light source for display operations of the display panel. The reliability of the liquid crystal display device is related to the structure and performance of the backlight.

SUMMARY

According to an aspect of the present disclosure, a light-emitting substrate is provided. The light-emitting substrate comprises: a substrate comprising a light-emitting region; a first conductor on the substrate and arranged at least in the light-emitting region, the first conductor extending along a first direction in the light-emitting region; a second conductor on a side of the first conductor away from the substrate and arranged in the light-emitting region, the second conductor comprising a first connecting portion; and a first insulator within the light-emitting region. The first connecting portion of the second conductor extends along a second direction intersecting with the first direction, a first orthographic projection of the first connecting portion of the second conductor on the substrate at least partially overlaps with a second orthographic projection of the first conductor on the substrate, a region where the first orthographic projection and the second orthographic projection overlap constitutes an overlapping region. The first insulator is only between the first connecting portion of the second conductor and the first conductor, and the overlapping region is within an orthographic projection of the first insulator on the substrate.

In some embodiments, an orthographic projection of a portion of each of two sides of the first conductor extending along the first direction on the substrate is within the orthographic projection of the first insulator on the substrate, the portion of each of two sides of the first conductor is in the overlapping region. An orthographic projection of a portion of each of two sides of the first connecting portion of the second conductor extending along the second direction on the substrate is within the orthographic projection of the first insulator on the substrate, the portion of each of two sides of the first connecting portion of the second conductor is in the overlapping region.

In some embodiments, the light-emitting substrate further comprises a cover layer on a side of the second conductor away from the substrate, the cover layer comprises a plurality of first openings, an orthographic projection of the plurality of first openings of the cover layer on the substrate do not overlap with the orthographic projection of the first insulator on the substrate.

In some embodiments, a ratio of an area of the orthographic projection of the first insulator on the substrate to an area of the substrate is approximately 10%.

In some embodiments, an area of the orthographic projection of the first insulator on the substrate is smaller than an area of an orthographic projection of the second conductor on the substrate.

In some embodiments, the first connecting portion of the second conductor comprises at least two sub-first connecting portions extending along the second direction and spaced apart from each other, orthographic projections of the at least two sub-first connecting portions on the substrate at least partially overlap with the orthographic projection of the same first insulator on the substrate.

In some embodiments, an interval between two adjacent sub-first connecting portions among the at least two sub-first connecting portions is greater than 300 μm.

In some embodiments, the first connecting portion of the second conductor further comprises a first merging portion and a second merging portion, the first merging portion and the second merging portion are respectively on both sides of the first conductor, two ends of the at least two sub-first connecting portions respectively merge at the first merging portion and the second merging portion, and orthographic projections of the first merging portion and the second merging portion on the substrate do not overlap with an orthographic projection of the overlapping region on the substrate.

In some embodiments, one of the at least two sub-first connecting portions comprises two notches, the two notches are respectively on both sides of the first conductor, and a middle portion of the sub-first connecting portion is disconnected from two ends of the sub-first connecting portion at the two notches.

In some embodiments, the same first insulator comprises at least two sub-insulators extending along the second direction and spaced apart from each other, a number of the sub-insulators is equal to a number of the sub-first connecting portions, and an orthographic projection of each of the sub-first connecting portions on the substrate at least partially overlaps with an orthographic projection of the corresponding one of the sub-insulators on the substrate.

In some embodiments, the second conductor further comprises a second connecting portion, and the second connecting portion of the second conductor is electrically connected to the first conductor, and the orthographic projection of the plurality of first openings of the cover layer on the substrate does not overlap with an orthographic projection of the second connecting portion of the second conductor on the substrate.

In some embodiments, the light-emitting substrate further comprises a second insulating layer, the second insulating layer is between the first conductor and the second conductor, and the first insulator is on a side of the second insulating layer away from the substrate.

In some embodiments, the second connecting portion of the second conductor is connected to the first conductor through a second via in the second insulating layer.

In some embodiments, the second insulating layer is only at the overlapping region.

In some embodiments, the second conductor further comprises a plurality of conductive pads, and an orthographic projection of each of the plurality of first openings of the cover layer on the substrate covers an orthographic projection of at least one of the plurality of conductive pads on the substrate.

In some embodiments, the light-emitting substrate further comprises: a third insulating layer between the second conductor and the cover layer and comprising a plurality of third vias; and a fourth insulating layer between the third insulating layer and the cover layer and comprising a plurality of fourth vias. Each of the plurality of third vias penetrates a corresponding one of the plurality of fourth vias, and the plurality of third vias and the plurality of fourth vias expose the plurality of conductive pads.

In some embodiments, the light-emitting substrate further comprises a fifth insulating layer between the second conductor and the second insulating layer, the fifth insulating layer covers the first insulator and the second insulating layer.

In some embodiments, a material of the first insulator is an organic material.

In some embodiments, a thickness of a portion of the first insulator in the overlapping region in a thickness direction of the substrate is about 2.5 μm.

In some embodiments, the second conductor further comprises a main body, the main body is on both sides of the first connecting portion, a first end of the main body on one side of the first connecting portion is connected with a first end of the first connecting portion, a second end of the main body on the one side of the first connecting portion is connected with the second connecting portion, and a first end of the main body on the other side of the first connecting portion is connected with a second end of the first connecting portion.

In some embodiments, the light-emitting substrate further comprises a plurality of light-emitting elements. Each of the plurality of light-emitting elements is a mini light-emitting diode or a micro light-emitting diode.

In some embodiments, there is a voltage difference between the first conductor and the second conductor.

According to another aspect of the present disclosure, there is provided a display device. The display device comprises the light-emitting substrate described in any one of the preceding embodiments.

According to yet another aspect of the present disclosure, a method for manufacturing a light-emitting substrate is provided. The method comprises: providing a substrate comprising a light-emitting region; forming a first conductor on the substrate, the first conductor being arranged at least in the light-emitting region and extending along a first direction in the light-emitting region; forming a first insulator on a side of the first conductor away from the substrate, the first insulator being within the light-emitting region; and forming a second conductor on a side of the first insulator away from the substrate, the second conductor being arranged in the light-emitting region and comprising a first connecting portion, the first connecting portion of the second conductor extending along a second direction intersecting with the first direction, a first orthographic projection of the first connecting portion of the second conductor on the substrate at least partially overlapping with a second orthographic projection of the first conductor on the substrate, a region where the first orthographic projection and the second orthographic projection overlap constituting an overlapping region, the first insulator being only between the first connecting portion of the second conductor and the first conductor, and the overlapping region being within an orthographic projection of the first insulator on the substrate.

In some embodiments, the forming the first conductor, the first insulator and the second conductor comprises: applying a first conductive layer on the substrate, patterning the first conductive layer through a first mask process to form the first conductor; applying a second insulating material layer on a side of the first conductor away from the substrate and applying a first insulating material layer on a side of the second insulating material layer away from the substrate, patterning the first insulating material layer and the second insulating material layer through a second mask process to form the first insulator and a second insulating layer; applying a second conductive layer on a side of the first insulator and the second insulating layer away from the substrate, patterning the second conductive layer through a third mask process to form the second conductor; applying a third insulating material layer on a side of the second conductor away from the substrate and applying a fourth insulating material layer on a side of the third insulating material layer away from the substrate, patterning the third insulating material layer and the fourth insulating material layer through a fourth mask process to form a third insulating layer and a fourth insulating layer.

In some embodiments, after forming the first insulator and the second insulating layer and before forming the second conductor, further comprising: applying a fifth insulating material layer on a side of the second insulating layer away from the substrate to cover the first insulator and the second insulating layer, patterning the fifth insulating material layer through a fifth mask process to form a fifth insulating layer.

In some embodiments, the forming the second conductor further comprises: patterning the second conductive layer through the third mask process, such that the first connecting portion of the second conductor comprises at least two sub-first connecting portions extending along the second direction and spaced apart from each other, in response to detecting fault of one of the at least two sub-first connecting portions, using a laser to cut both sides of the faulty sub-first connecting portion, so that a middle portion and two ends of the faulty sub-first connecting portion are disconnected.

BRIEF DESCRIPTION OF THE DRAWINGS

In order to describe the technical solutions in the embodiments of the present disclosure more clearly, the accompanying drawings required in the embodiments will be briefly introduced below. Obviously, the drawings in the following description are only some embodiments of the present disclosure. For those of ordinary skill in the art, other drawings can also be obtained from these drawings without any creative effort.

DETAILED DESCRIPTION OF THE DISCLOSURE

Figure 1A:
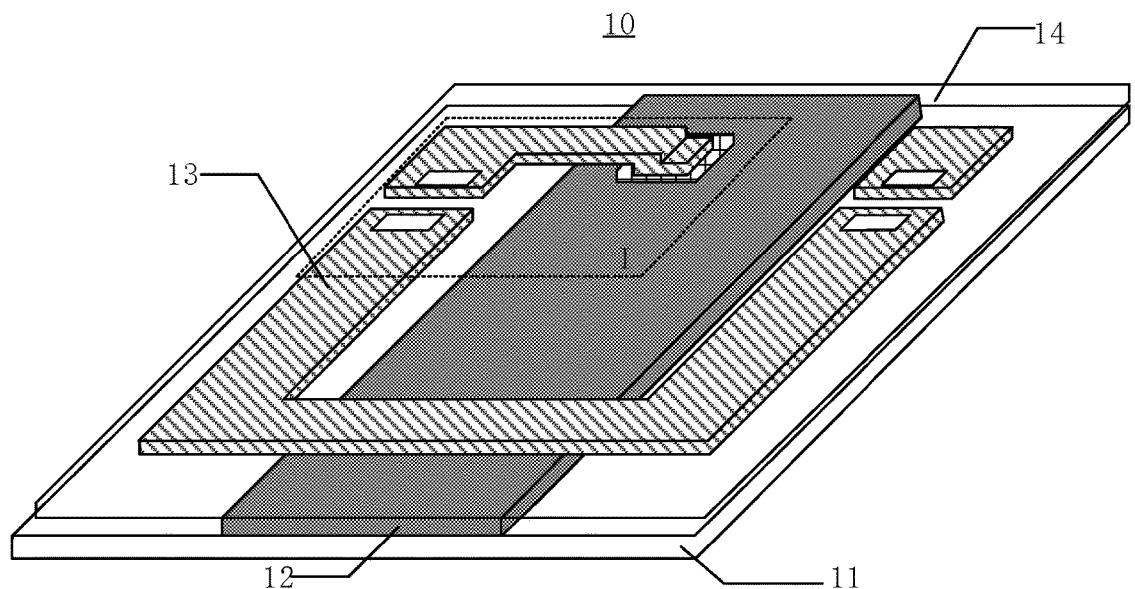
FIG. 1A is a schematic plan view of a light-emitting substrate in the related art.

The technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those of ordinary skill in the art without creative efforts shall fall within the protection scope of the present disclosure.

It can be understood that, the drawings in the embodiments of the present disclosure are only used to schematically illustrate the connection relationship between the components. The dimensions of the components in the drawings are not drawn to scale, and their relative positional relationship do not necessarily correspond exactly to the actual location. In the drawings, the scale of certain regions and layers may be exaggerated for clarity.

In the related art, a light-emitting substrate of a display device (e.g., a light-emitting substrate of a backlight) comprises at least two conductive layers, such as a first conductive layer and a second conductive layer. The first conductive layer is usually used as various types of signal lines to transmit corresponding electrical signals, and the second conductive layer located at a different layer from the first conductive layer is usually used as conductive pads and connection leads for connecting light-emitting elements. With the cooperation of the first conductive layer and the second conductive layer, the light-emitting elements of the light-emitting substrate can be controlled to emit light. The first conductive layer and the second conductive layer inevitably overlap in the direction perpendicular to the substrate. An insulating layer is usually disposed between the first conductive layer and the second conductive layer, and particles in the environment may be entrained into the insulating layer during the manufacturing process. If the distance between the first conductive layer and the second conductive layer is close in the direction perpendicular to the substrate, on the one hand, particles may penetrate the insulating layer between the first conductive layer and the second conductive layer, resulting in a short circuit between the first conductive layer and the second conductive layer; on the other hand, a short distance will cause a very obvious mutual capacitance between the first conductive layer and the second conductive layer, which affects the electrical performance of the light-emitting substrate. Therefore, a thicker insulating layer needs to be provided in the overlapping region of the first conductive layer and the second conductive layer. However, due to the limitation of the manufacturing process, the inorganic insulating layer usually cannot form a thick film, while the organic insulating layer is formed by a coating process, and the thickness of the film (for example, the thickness is 3.0~10.0 µm) can satisfy the thickness requirements of the insulating layer. Therefore, a stack of inorganic insulating layer and organic insulating layer is usually provided between the first conductive layer and the second conductive layer.

Figure 1B:
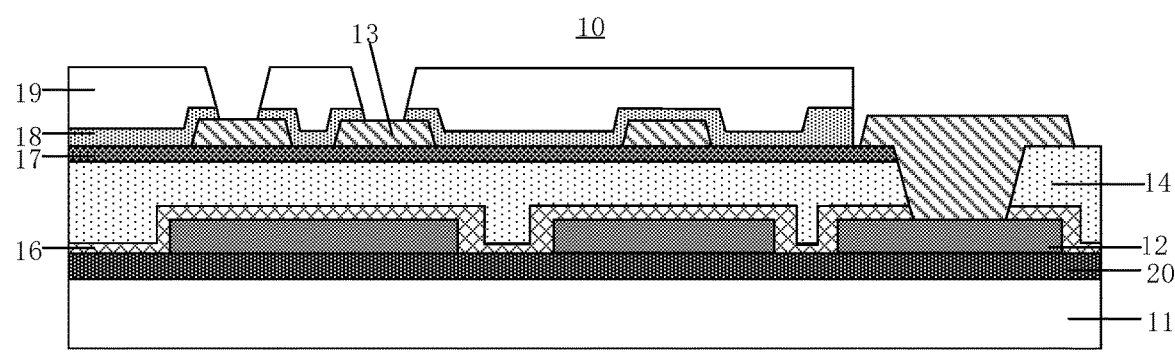
FIG. 1B is a schematic cross-sectional view of a light-emitting substrate in the related art.

However, since organic macromolecules have water absorption, the organic insulating layer composed of organic materials generally has water absorption. The light-emitting substrate is provided with devices such as light-emitting elements and driving circuits, and vias are usually provided at the positions where the light-emitting elements and driving circuits are located to realize electrical connection between the light-emitting elements and driving circuits and other wires or circuits. During the manufacturing process, water vapor in the air will enter the interior of the light-emitting substrate along the vias of the light-emitting elements and the driving circuits. FIG. 1A illustrates a schematic plan view of a light-emitting substrate 10 in the related art, and FIG. 1B illustrates a schematic cross-sectional view of the light-emitting substrate 10 in the related art. As illustrated in FIGS. 1A and 1B, the light-emitting substrate 10 comprises a substrate 11, a first conductive layer 12, a second conductive layer 13, and an organic insulating layer 14 between the first conductive layer 12 and the second conductive layer 13. The organic insulating layer 14 is laid over the first conductive layer 12 as a whole, so as to substantially completely cover the lower first conductive layer 12. As mentioned above, the organic insulating layer 14 has water absorption, so the water vapor entering the interior of the light-emitting substrate 10 through the vias can travel a certain distance inside the organic insulating layer 14. The first conductive layer 12 and the second conductive layer 13 have an overlapping region in the direction perpendicular to the substrate 11. The water vapor moving inside the organic insulating layer 14 is concentrated at a position of the organic insulating layer 14 corresponding to the overlapping region of the first conductive layer 12 and the second conductive layer 13. Under the influence of potential difference and water molecules, the overlapping portion of the first conductive layer 12 and the second conductive layer 13 is prone to electrochemical corrosion, resulting in a short circuit between the first conductive layer 12 and the second conductive layer 13, which in turn causes a partial region of the light-emitting substrate 10 to fail.

Figure 2:
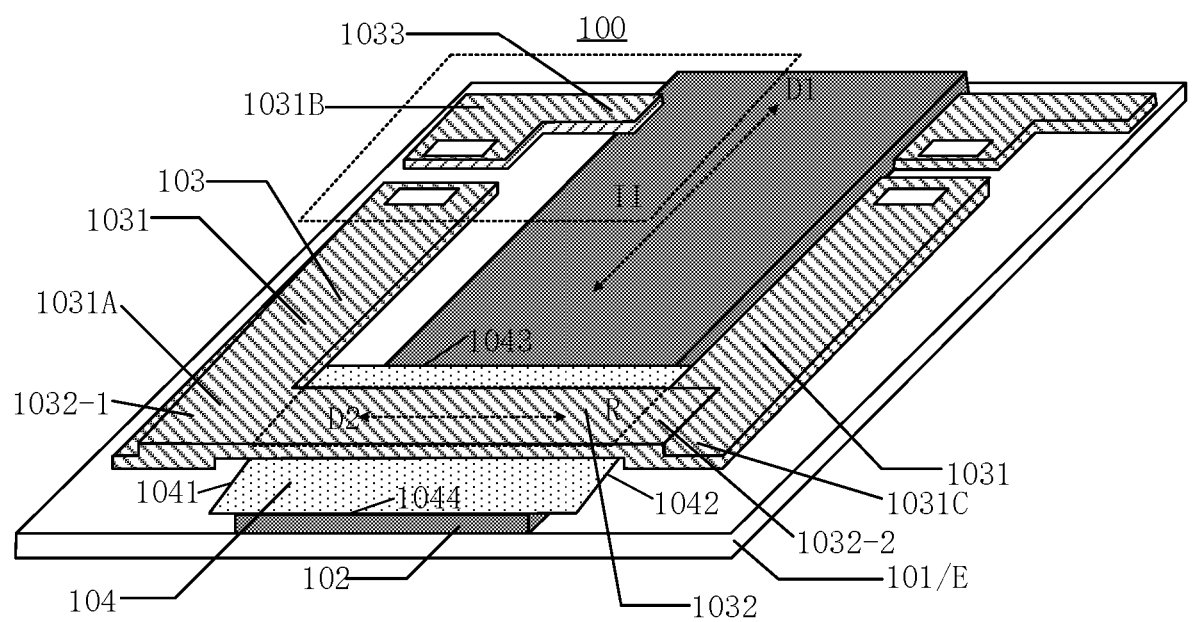
FIG. 2 is a schematic plan view of a part of a light-emitting substrate according to an embodiment of the present disclosure.

In order to solve the above problems, embodiments of the present disclosure provide a light-emitting substrate, and FIG. 2 illustrates a schematic plan view of a part of the light-emitting substrate 100. As illustrated in FIG. 2, the light-emitting substrate 100 comprises: a substrate 101 comprising a light-emitting region E; a first conductor 102 located on the substrate 101 and arranged at least in the light-emitting region E, the first conductor 102 extends along a first direction D1 in the light-emitting region E; a second conductor 103 located on a side of the first conductor 102 away from the substrate 101 and arranged in the light-emitting region E, the second conductor 103 comprises a first connecting portion 1032, the first connecting portion 1032 of the second conductor 103 extends along a second direction D2 intersecting with the first direction D1, a first orthographic projection of the first connecting portion 1032 of the second conductor 103 on the substrate 101 at least partially overlaps with a second orthographic projection of the first conductor 102 on the substrate 101, and a region where the first orthographic projection and the second orthographic projection overlap constitutes an overlapping region R; and a first insulator 104 located in the light-emitting region E, the first insulator 104 is only located between the first connecting portion 1032 of the second conductor 103 and the first conductor 102, and the overlapping region R falls within an orthographic projection of the first insulator 104 on the substrate 101.

It should be noted that the region illustrated in FIG. 2 is a portion of the light-emitting region E of the light-emitting substrate 100, and other regions of the light-emitting substrate 100 (e.g., the fan-out region, the bonding region, etc.) are not illustrated in FIG. 2. In addition, in this application, terms such as "XX extends along a first direction D1" means that the XX as a whole is basically arranged along the first direction D1, but it is not required that every section of the XX must be arranged strictly along the first direction D1 without any slight deviation. For example, in the light-emitting region E, it is possible that all sections of the first conductor 102 are wired along the first direction D1, and it is also possible that most of the sections of the first conductor 102 are wired along the first direction D1, while a small portion of the sections is wired along the second direction D2 or any other direction having a non-zero angle with the first direction D1. Both cases can be understood as the first conductor 102 extending along the first direction D1. Similarly, terms such as "XX extends along a second direction D2" mean that the XX as a whole is substantially arranged along the second direction D2, but it is not required that every section of the XX must be arranged strictly along the second direction D2 without any slight deviation.

The first connecting portion 1032 of the second conductor 103 connects the main bodies 1031 (which will be described in detail later) located on both sides of the first connecting portion 1032. The main body 1031 of the second conductor 103 is usually provided with light-emitting elements and is electrically connected to the light-emitting elements. The existence of the first connecting portion 1032 can connect the light-emitting elements on the main body 1031 on both sides of the first connecting portion 1032 in series. In the embodiment of the present disclosure, in order to prevent the first conductor 102 and the second conductor 103 from short circuit at the overlapping region, the first insulator 104 is only provided in the overlapping region of the first conductor 102 and the second conductor 103 (i.e., between the first connecting portion 1032 of the second conductor 103 and the first conductor 102), while the first insulator 104 is not provided above the region of the first conductor 102 that does not overlap with the second conductor 103. Therefore, compared to the related art, the light-emitting substrate 100 in the embodiment of the present disclosure abandons the design that the organic insulating layer has a large area, but designs a bridge structure of an extremely narrow organic insulating layer only in the overlapping region of the first conductor 102 and the second conductor 103, that is, the first insulator 104. Compared with the organic insulating layer with a large area, the extremely narrow first insulator 104 is significantly reduced in both area and volume, so it has very weak or even negligible water absorption. Moreover, since the first insulator 104 is only disposed between the first connecting portion 1032 of the second conductor 103 and the first conductor 102, it perfectly avoids the via position of the light-emitting element, so even if water vapor enters the interior of the light-emitting substrate 100 along the via of the light-emitting element, it will not contact the first insulator 104, so that the electrochemical corrosion between the first conductor 102 and the second conductor 103 caused by the intrusion of water vapor can be avoided. The electrochemical corrosion rate of the light-emitting substrate 100 during the process is reduced, and the reliability level of the light-emitting substrate 100 and the product comprising the light-emitting substrate 100 is effectively improved.

Since the first insulator 104 is mainly used to avoid short circuit caused by the electrical connection between the first conductor 102 and the first connecting portion 1032 of the second conductor 103, the four sides of the first insulator 104 need to expand beyond the portion of the sides of the first conductor 102 located in the overlapping region R and the portion of the sides of the second conductor 103 located in the overlapping region R. As illustrated in FIG. 2, the orthographic projections of the portions of the two sides of the first conductor 102 which extend along the first direction D1 and are located in the overlapping region R (that is, the portions of the two sides of the first conductor 102 extending along the first direction D1 that overlap with the first insulator 104) on the substrate 101 respectively fall within the orthographic projection of the first insulator 104 on the substrate 101, and the orthographic projections of the portions of the two sides of the first connecting portion 1032 of the second conductor 103 which extend along the second direction D2 and are located in the overlapping region R on the substrate 101 respectively fall within the orthographic projection of the first insulator 104 on the substrate 101. In other words, the two sides 1041 and 1042 of the first insulator 104 extending in the first direction D1 respectively extend beyond in the second direction D2 the portions of the two sides of the first conductor 102 extending along the first direction D1 and located in the overlapping region R, and the two sides 1043 and 1044 of the first insulator 104 extending in the second direction D2 respectively extend beyond in the first direction D1 the portions of the two sides of the first connecting portion 1032 of the second conductor 103 extending along the second direction D2 and located in the overlapping region R. The specific value of the outward expansion distance of the four sides of the first insulator 104 is determined by the process precision, which is not specifically limited in the embodiment of the present disclosure. In an example, the two sides 1041 and 1042 of the first insulator 104 extend in the second direction D2 beyond the two sides of the first conductor 102 extending in the first direction D1 by a distance greater than 10 μm and less than 100 μm, respectively, and the two sides 1043 and 1044 of the first insulator 104 extend in the first direction D1 beyond the two sides of the first connecting portion 1032 of the second conductor 103 extending in the second direction D2 by a distance greater than 10 μm and less than 100 μm, respectively.

The material of the first insulator 104 may be an organic material, so that an appropriate thickness can be formed through a coating process to meet the structural and electrical requirements of the first conductor 102 and the second conductor 103. The embodiment of the present disclosure does not limit the specific composition of the organic material of the first insulator 104. In an example, the first insulator 104 is an OC (Over Coating) layer, which is a negative photoresist composed of an organic material.

As illustrated in FIG. 2, the second conductor 103 further comprises a main body 1031 and a second connecting portion 1033, and the second connecting portion 1033 of the second conductor 103 is electrically connected to the first conductor 102. The main body 1031 of the second conductor 103 is located on both sides of the first connecting portion 1032, the first end 1031A of the main body 1031 located on one side of the first connecting portion 1032 (e.g. located on the left side of the first connecting portion 1032 in FIG. 2) is connected to the first end 1032-1 of the first connecting portion 1032, the second end 1031B of the main body 1031 on the one side of the first connecting portion 1032 is connected to the second connecting portion 1033, the first end 1031C of the main body 1031 located on the other side of the first connecting portion 1032 (e.g. located on the right side of the first connecting portion 1032 in FIG. 2) is connected to the second end 1032-2 of the first connecting portion 1032. The main body 1031, the first connecting portion 1032 and the second connecting portion 1033 of the second conductor 103 make the second conductor 103 appear like a "U-shaped" shape.

Figure 3A:
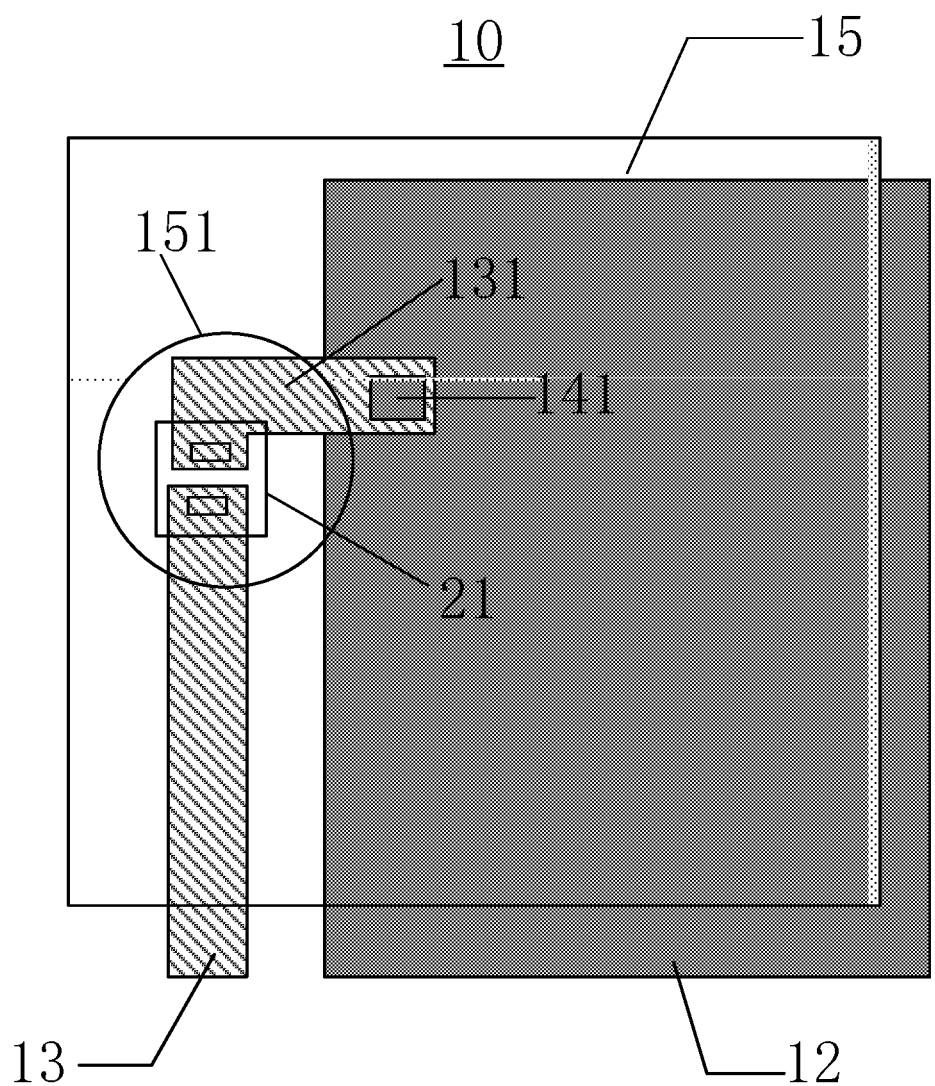
FIG. 3A is a partially enlarged schematic view of the region I of the light-emitting substrate in FIG. 1A.
Figure 3B:
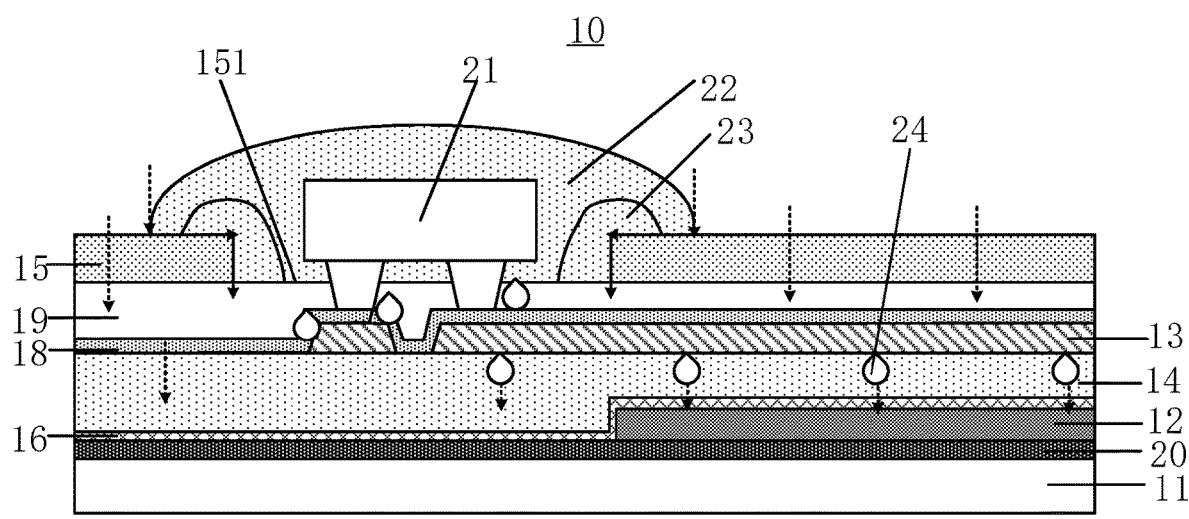
FIG. 3B is another schematic cross-sectional view of a light-emitting substrate in the related art.

FIG. 3A is a partial enlarged view of the region I of the light-emitting substrate 10 in FIG. 1A, and FIG. 3B is another cross-sectional view of the light-emitting substrate 10. As illustrated in FIGS. 3A and 3B, in the related art, the light-emitting substrate 10 further comprises a cover layer 15 and a light-emitting element 21 located on the side of the second conductive layer 13 away from the substrate 11. The cover layer 15 comprises an opening 151, and the light-emitting element 21 is electrically connected to the second conductive layer 13 via the opening 151. In the light-emitting substrate 10, on the one hand, the second conductive layer 13 is generally designed to be as close as possible to the first conductive layer 12 in the horizontal direction. On the other hand, the connecting portion 131 of the second conductive layer 13 is electrically connected to the first conductive layer 12 through the via 141 in the organic insulating layer 14. Since the via 141 needs to be avoided from overlapping the edge of the first conductive layer 12, the distance from the via 141 to the edge of the first conductive layer 12 needs to be at least 20 μm. For the above two reasons, as illustrated in FIG. 3A, the opening 151 of the cover layer 15 exposes the connecting portion 131 of the second conductive layer 13, that is, the orthographic projection of the opening 151 of the cover layer 15 on the substrate 11 at least partially overlaps the orthographic projection of the connecting portion 131 of the second conductive layer 13 on the substrate 11. The connecting portion 131 of the second conductive layer 13 overlaps with the first conductive layer 12, and the opening 151 of the cover layer 15 is a position where water vapor can easily penetrate. As illustrated in FIG. 3B, the water vapor 24 intrudes into the interior of the light-emitting substrate 10 along the edges of the sealants 22 and 23 and the opening 151, penetrates into the connecting portion 131 of the second conductive layer 13 and the first conductive layer 12 through films, thereby resulting in electrochemical corrosion of the connecting portion 131 of the second conductive layer 13 and the first conductive layer 12, resulting in a short circuit between the first conductive layer 12 and the second conductive layer 13, which in turn resulting in the failure of some regions of the light-emitting substrate 10.

Figure 4:
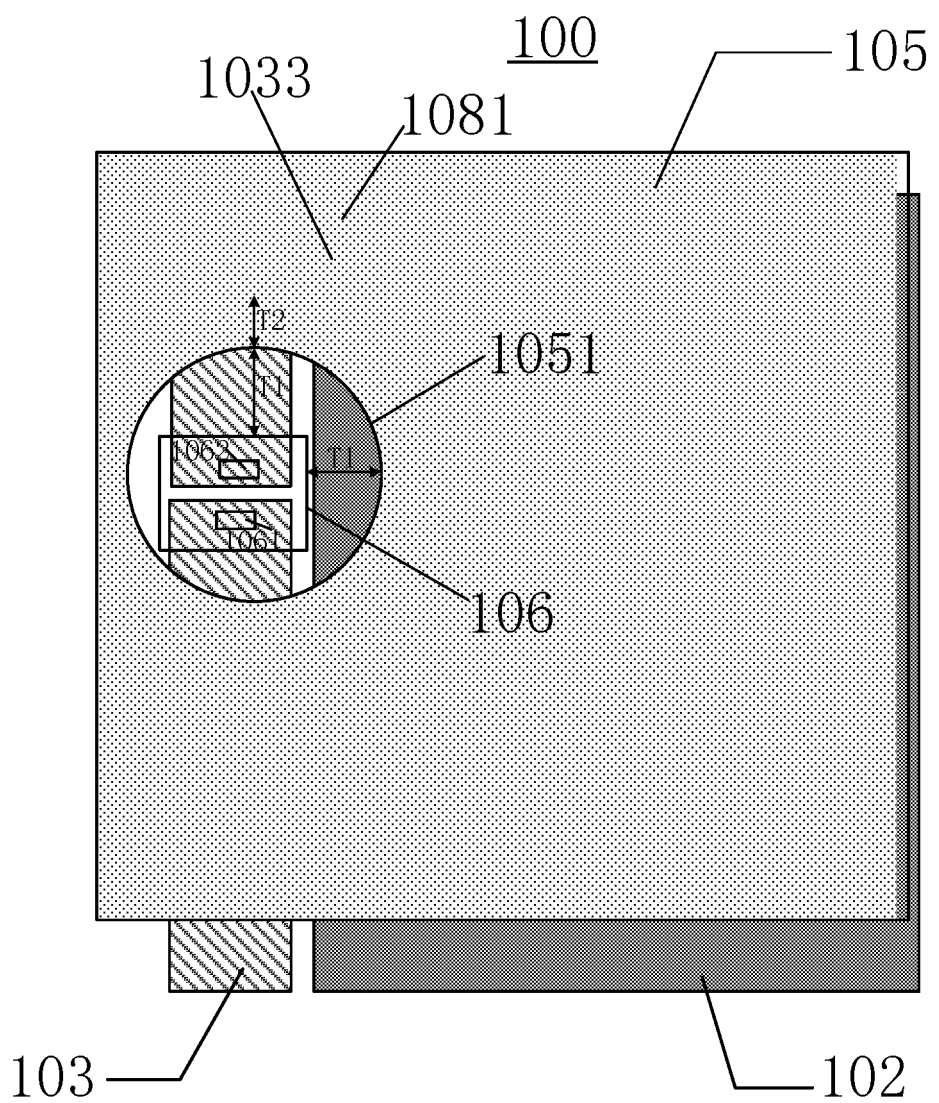
FIG. 4 is a partially enlarged schematic view of the region II of the light-emitting substrate in FIG. 2.

FIG. 4 is a partial enlarged view of the region II of the light-emitting substrate 100 in FIG. 2 according to an embodiment of the present disclosure. In FIG. 2, in order to illustrate the structures of the first conductor 102 and the second conductor 103 more clearly, the cover layer 105 on the side of the second conductor 103 away from the substrate 101 is omitted. As illustrated in FIG. 4, the light-emitting substrate 100 further comprises a cover layer 105 and a plurality of light-emitting elements 106. The cover layer 105 is located on the side of the second conductor 103 away from the substrate 101 and comprises a plurality of first openings 1051. The plurality of light-emitting elements 106 are located on the side of the cover layer 105 away from the substrate 101, and each light-emitting element 106 is electrically connected to the main body 1031 of the second conductor 103 via a corresponding first opening 1051. FIG. 4 illustrates only one light-emitting element 106 and one first opening 1051 of the cover layer 105 as an example. The second connecting portion 1033 of the second conductor 103 is electrically connected to the first conductor 102 and the main body 1031 of the second conductor 103 is electrically connected to the light-emitting element 106, the electrical signal carried by the first conductor 102 can be transmitted to the light-emitting element 106 via the second connecting portion 1033 and the main body 1031 of the second conductor 103 to drive the light-emitting element 106 to emit light. In some embodiments, the first conductor 102 may be a driving voltage signal line VLEDL and/or a common voltage signal line GNDL, and the second conductor 103 is a lead connecting the light-emitting elements 106.

The orthographic projection of the second connecting portion 1033 of the second conductor 103 on the substrate 101 at least partially overlaps with the orthographic projection of the first conductor 102 on the substrate 101, and the orthographic projection of the plurality of first openings 1051 of the cover layer 105 on the substrate 101 does not overlap with the orthographic projection of the second connecting portion 1033 of the second conductor 103 on the substrate 101. That is, the first opening 1051 of the cover layer 105 does not expose the second connecting portion 1033 of the second conductor 103, but the cover layer 105 covers the second connecting portion 1033 of the second conductor 103. With this arrangement, even though the water vapor may enter the inside of the light-emitting substrate 100 along the first opening 1051 of the cover layer 105 during the manufacturing process, since the cover layer 105 does not have water absorption, the water vapor will not travel inside the cover layer 105. Therefore, the invading water vapor exists at the position where the first opening 1051 is located at most, without migrating to the second connecting portion 1033 of the second conductor 103 away from the first opening 1051. Therefore, the overlapping portion of the second connecting portion 1033 of the second conductor 103 and the first conductor 102 will not undergo electrochemical corrosion.

It should be noted that FIG. 4 illustrates that the first opening 1051 of the cover layer 105 exposes a portion of the main body 1031 of the second conductor 103, but this has no effect, the main body 1031 of the second conductor 103 does not have any overlap with the first conductor 102. Therefore, even though the main body 1031 of the second conductor 103 may be corroded by water vapor, the electrochemical reaction between the first conductor 102 and the second conductor 103 will not be caused to cause electrochemical corrosion.

The number of the plurality of light-emitting elements 106 is equal to the number of the plurality of first openings 1051 of the cover layer 105, that is, at the position where each light-emitting element 106 is located, the cover layer 105 is correspondingly provided with a first opening 1051, to allow the light-emitting element 106 to be connected to the main body 1031 of the second conductor 103 via the first opening 1051. The second conductor 103 comprises a plurality of conductive pads, such as a positive conductive pad 1061 and a negative conductive pad 1062. The light-emitting element 106 is connected to the main body 1031 of the second conductor 103 through these two conductive pads 1061 and 1062. The orthographic projection of each light-emitting element 106 on the substrate 101 falls within the orthographic projection of a corresponding first opening 1051 on the substrate 101, that is, the area of the first opening 1051 of the cover layer 105 is larger than the area occupied by the light-emitting element 106. In an example, as illustrated in FIG. 4, the shape of the first opening 1051 of the cover layer 105 is circular, and the distance T1 between the side edge of the light-emitting element 106 and the corresponding side edge of the first opening 1051 is 0.5 mm. For example, as illustrated in the figure, the distance T1 between the right edge of the light-emitting element 106 and the right side of the circular first opening 1051 is 0.5 mm, and the distance T1 between the upper edge of the light-emitting element 106 and the upper side of the circular first opening 1051 is 0.5 mm. Similarly, the distance T1 between the left edge of the light-emitting element 106 and the left side of the circular first opening 1051 is 0.5 mm, and the distance T1 between the lower edge of the light-emitting element 106 and the lower side of the circular first opening 1051 is 0.5 mm. The cover layer 105 is usually formed by a screen printing process, and the screen printing accuracy is about 0.3 mm. Therefore, in order to ensure that the first opening 1051 and the second connecting portion 1033 of the second conductor 103 do not overlap, the distance T2 between the uppermost point of the circular first opening 1051 and the second connecting portion 1033 of the second conductor 103 should be greater than 0.3 mm. With such a design, the distance between the upper edge of the light-emitting element 106 and the second connecting portion 1033 of the second conductor 103 is T1+T2, that is, greater than 0.8 mm. Therefore, no matter how the position of the first opening 1051 of the cover layer 105 deviates within the accuracy range during the manufacturing process, the first opening 1051 of the cover layer 105 can perfectly avoid the second connecting portion 1033 of the second conductor 103, so as not to overlap with the second connecting portion 1033 of the second conductor 103.

The orthographic projection of the plurality of first openings 1051 of the cover layer 105 on the substrate 101 also does not overlap with the orthographic projection of the first insulator 104 on the substrate 101. In an example, referring to FIGS. 2 and 4, the distance between the side 1043 of the first insulator 104 and the first opening 1051 of the cover layer 105 is 1-2 mm. With this arrangement, the water vapor intruding along the first opening 1051 cannot contact the first insulator 104, so that the first insulator 104 can play a good insulating effect between the first conductor 102 and the first connecting portion 1032 of the second conductor 103, and a short circuit between the first conductor 102 and the first connecting portion 1032 of the second conductor 103 can be avoided.

The material of the cover layer 105 may be any appropriate material, and the embodiment of the present disclosure does not specifically limit the material of the cover layer 105. In an example, the material of the cover layer 105 is white oil. The cover layer 105 may be a reflective layer with a reflective function, so as to reflect the light emitted by the light-emitting element 106 toward the user, thereby improving the utilization rate of the light source.

The light-emitting element 106 may be a mini light-emitting diode (Mini LED) or a micro light-emitting diode (Micro LED). The size of the Mini LED is, for example, in the range of 100 micrometers to 500 micrometers, the size of the Micro LED is, for example, less than 100 micrometers. The embodiments of the present disclosure do not limit the type and size of the light-emitting element 106. By using Mini LED or Micro LED as the light-emitting element 106, a high dynamic range (HDR) display can be realized. When such a light-emitting substrate is used in a display device, the contrast of the display device can be significantly improved.

It should be noted that, in addition to the light-emitting element 106, the light-emitting substrate 100 may also comprise other electronic devices, comprising but not limited to sensor devices, integrated circuits, and the like. The cover layer 105 is provided with the first openings 1051 at positions corresponding to these electronic devices, and the positional relationship between the first opening 1051 and the first insulator 104 at these positions can be designed according to the positional relationship between the first opening 1051 of the cover layer 105 and the first insulator 104 as described above.

In some embodiments, the ratio of the area of the orthographic projection of the first insulator 104 on the substrate 101 to the area of the substrate 101 is substantially 10%. The term "substantially 10%" means that the ratio may be equal to 10%, may be slightly less than 10%, or may be slightly greater than 10%. In some embodiments, the area of the orthographic projection of the first insulator 104 on the substrate 101 is smaller than the area of the orthographic projection of the second conductor 103 on the substrate 101. As mentioned above, in the related art, the organic insulating layer has a large area, that is, the area of the organic insulating layer is substantially equal to the area of the substrate, and the second conductive layer is only arranged in some regions on the substrate, so in the related art, the area of the organic insulating layer is larger than the area of the second conductive layer. However, in the embodiment of the present disclosure, by disposing the first insulator 104 only at the overlapping region R of the first conductor 102 and the second conductor 103 and not at other regions, the area of the first insulator 104 is much smaller than the area of the second conductor 103. Compared with the related art, the light-emitting substrate provided by the embodiments of the present disclosure significantly reduces the area of the first insulator 104, so that the first insulator 104 has very weak or even negligible water absorption, so that the electrochemical corrosion between the first conductor 102 and the second conductor 103 can be avoided, the reliability of the light-emitting substrate can be improved, and because the first insulator 104 has a smaller area, the organic material used can be saved, and the production cost can be reduced.

Figure 5:
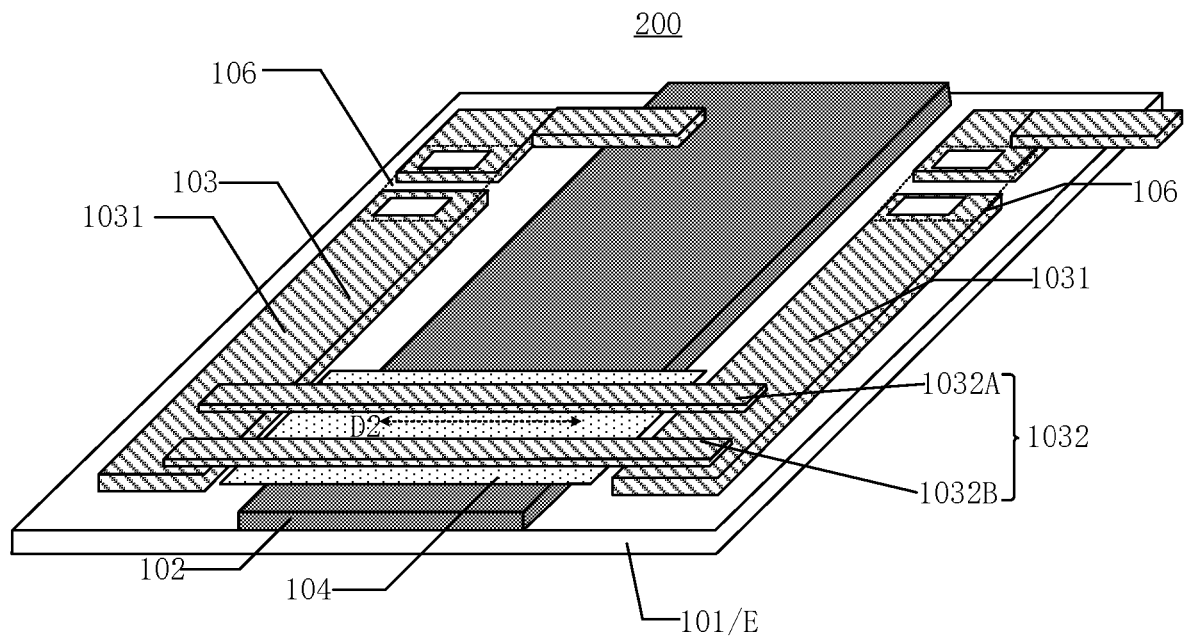
FIG. 5 is a schematic plan view of a part of a light-emitting substrate according to another embodiment of the present disclosure.

FIG. 5 illustrates a schematic plan view of a partial structure of the light-emitting substrate 200. The light-emitting substrate 200 illustrated in FIG. 5 has substantially the same configuration as the light-emitting substrate 100 illustrated in FIG. 2, and thus the same reference numerals are used to refer to the same components. Therefore, for the detailed functions of the components in FIG. 5 with the same reference numerals as those in FIG. 2, reference may be made to the description of FIG. 2, which will not be repeated here. It should be noted that, similar to FIG. 2, in FIG. 5, in order to illustrate the structures of the first conductor 102 and the second conductor 103 more clearly, the cover layer 105 on the side of the second conductor 103 away from the substrate 101 is omitted, but the light-emitting substrate 200 comprises the cover layer 105, and the arrangement of the cover layer 105 of the light-emitting substrate 200 is the same as that of the cover layer 105 of the light-emitting substrate 100. For the sake of brevity, the similarities between the light-emitting substrate 200 in FIG. 5 and the light-emitting substrate 100 in FIG. 2 will not be repeated, and only the differences will be described below.

As illustrated in FIG. 5, the first connecting portion 1032 of the second conductor 103 comprises at least two sub-first connecting portions extending along the second direction D2 and spaced apart from each other, and the orthographic projection of the at least two sub-first connecting portions on the substrate 101 at least partially overlaps with the orthographic projection of the same first insulator 104 on the substrate 101. FIG. 5 illustrates two sub-first connecting portions 1032A and 1032B (referred to as the first sub-connecting portion 1032A and the second sub-connecting portion 1032B) as an example, but this is only an example, the first connecting portion 1032 of the second conductor 103 may also comprise a greater number of sub-first connecting portions, such as three, four or even more, and the specific number of the sub-first connecting portions is not limited in the embodiment of the present disclosure. In an example, the interval between the first sub-connecting portion 1032A and the second sub-connecting portion 1032B is greater than 300 μm. When the first connecting portion 1032 of the second conductor 103 comprises a plurality of sub-first connecting portions, the interval between any two adjacent sub-first connecting portions in the plurality of sub-first connecting portions is greater than 300 μm.

The reason why the first connecting portion 1032 is designed to include at least two sub-first connecting portions and the interval between the two sub-first connecting portions is greater than 300 μm is that in the manufacturing process, particles in the environment are sometimes inevitably introduced between the first conductor 102 and the second conductor 103. If particles exist between the first conductor 102 and the first connecting portion 1032 of the second conductor 103, the particles may penetrate the film (s) between the first conductor 102 and the first connecting portion 1032 of the second conductor 103, so that a short circuit occurs between the first conductor 102 and the first connecting portion 1032 of the second conductor 103. Since both sides of the first connecting portion 1032 of the second conductor 103 are connected to the main body 1031 respectively, a light-emitting element 106 is provided on the main body 1031 on both sides respectively, and the first connecting portion 1032 connects the two light-emitting elements 106 in series. If the first connecting portion 1032 of the second conductor 103 is short circuit, the function of the two light-emitting elements 106 (and other light-emitting elements 106 connected in series with the two light-emitting elements 106) will fail, thereby causing bad phenomena of the light-emitting elements 106, such as light of burst, light of turned off. In an embodiment of the present disclosure, the first connecting portion 1032 comprises at least two sub-first connecting portions 1032A and 1032B, and the interval between the two sub-first connecting portions 1032A and 1032B is greater than 300 μm. Since the size of the particles is less than 300 μm, even when there are particles between the first conductor 102 and the first connecting portion 1032 of the second conductor 103, the "double bridges" design of the first connecting portion 1032 can ensure that at least one sub-first connecting portion of the two sub-first connecting portions is free from any particles, so that normal electrical connection can be realized, and the adjacent light-emitting elements 106 can be ensured to be normally connected in series.

Figure 6:
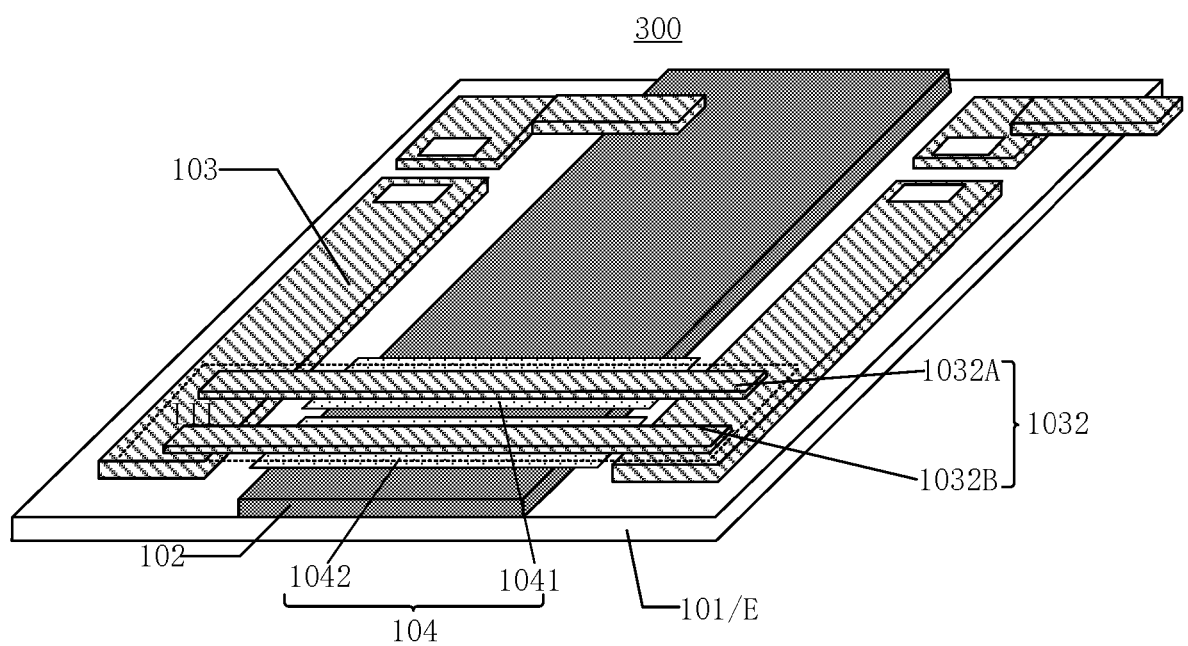
FIG. 6 is a schematic plan view of a part of a light-emitting substrate according to yet another embodiment of the present disclosure.

FIG. 6 illustrates a schematic plan view of a partial structure of a light-emitting substrate 300. The light-emitting substrate 300 illustrated in FIG. 6 has substantially the same configuration as the light-emitting substrate 200 illustrated in FIG. 5, and thus the same reference numerals are used to refer to the same components. Therefore, for the detailed functions of the components in FIG. 6 with the same reference numerals as those in FIG. 5, reference may be made to the descriptions of FIGS. 2 and 5, which will not be repeated here. It should be noted that, similar to FIG. 2, in FIG. 6, in order to show the structures of the first conductor 102 and the second conductor 103 more clearly, the cover layer 105 on the side of the second conductor 103 away from the substrate 101 is omitted, but the light-emitting substrate 300 comprises the cover layer 105, and the arrangement of the cover layer 105 of the light-emitting substrate 300 is the same as that of the cover layer 105 of the light-emitting substrate 100. For the sake of brevity, the similarities between the light-emitting substrate 300 in FIG. 6 and the light-emitting substrate 200 in FIG. 5 will not be repeated, and only the differences will be described below.

As illustrated in FIG. 6, the first insulator 104 of the light-emitting substrate 300 comprises at least two sub-insulators extending along the second direction D2 and spaced apart from each other, and the number of the at least two sub-insulators is equal to the number of the at least two sub-first connecting portions. When the first connecting portion 1032 of the second conductor 103 comprises two sub-first connecting portions, namely the first sub-connecting portion 1032A and the second sub-connecting portion 1032B, the first insulator 104 correspondingly comprises two sub-insulators which respectively are the first sub-insulator 1041 and the second sub-insulator 1042. The orthographic projection of the first sub-connecting portion 1032A on the substrate 101 at least partially overlaps with the orthographic projection of the first sub-insulator 1041 on the substrate 101, and the orthographic projection of the second sub-connecting portion 1032B on the substrate 101 at least partially overlaps with the orthographic projection of the second sub-insulator 1042 on the substrate 101. Similar to the previous description, the two sides of the first sub-insulator 1041 extending along the first direction D1 respectively extend beyond the portions of the two sides of the first conductor 102 extending along the first direction D1 and located in the overlapping region R, and the two sides of the first sub-insulator 1041 extending along the second direction D2 respectively extend beyond the portions of the two sides of the first sub-connecting portion 1032A extending along the second direction D2 and located in the overlapping region R. The two sides of the second sub-insulator 1042 extending along the first direction D1 respectively extend beyond the portions of the two sides of the first conductor 102 extending along the first direction D1 and located in the overlapping region R, and the two sides of the second sub-insulator 1042 extending along the second direction D2 respectively extend beyond the portions of the two sides of the second sub-connecting portion 1032B extending along the second direction D2 and located in the overlapping region R. In this way, the first sub-insulator 1041 and the second sub-insulator 1042 can provide a better insulating effect for the first conductor 102 and the second conductor 103.

Figure 7:
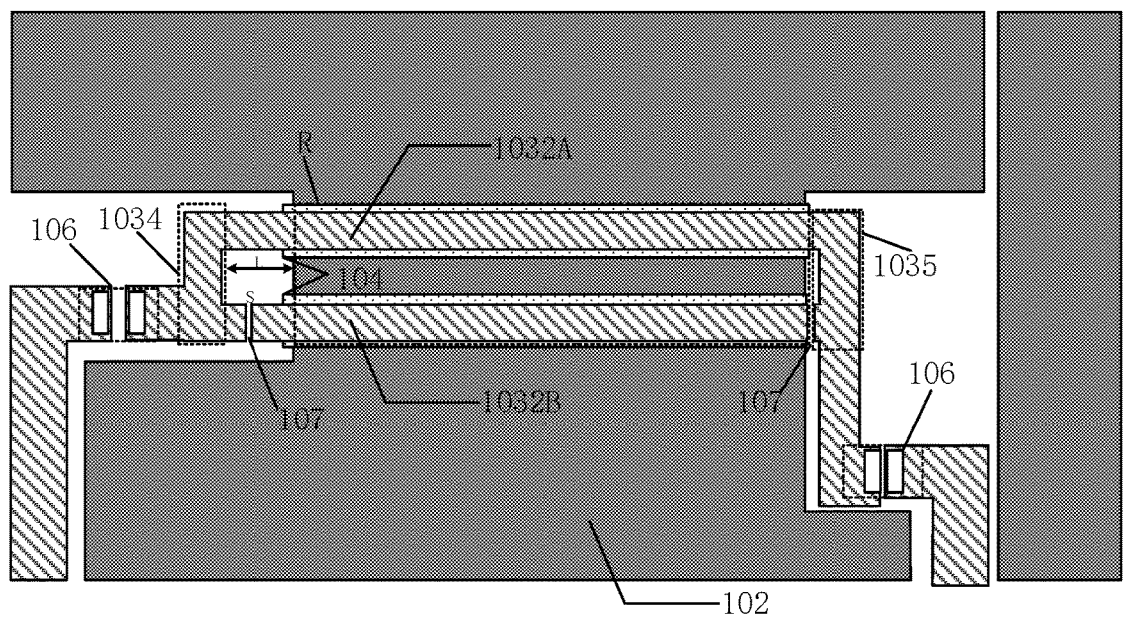
FIG. 7 is a partially enlarged schematic view of the region III of the light-emitting substrate in FIG. 6.

FIG. 7 is a partial enlarged view of the region III of the light-emitting substrate 300 in FIG. 6. Referring to FIG. 7, one of the first sub-connecting portion 1032A and the second sub-connecting portion 1032B (illustrated as the second sub-connecting portion 1032B in the figure) comprises two notches 107 on both sides, the two notches 107 are located on both sides of the first conductor 102, respectively, and the middle portion of the second sub-connecting portion 1032B is disconnected from the two ends of the second sub-connecting portion 1032B at the two notches 107. In an example, the minimum value of the pitch S of the notch 107 is 20 μm. By arranging the notches 107 on both sides of the first conductor 102 without overlapping with the first conductor 102 and the overlapping region R, damage to the first conductor 102 and the first insulator 104 can be avoided when the second sub-connecting portion 1032B is cut by the laser. In the manufacturing process, after the second conductor 103 is prepared or the second conductor 103 and the subsequent films are prepared, the all-in-one (AIO) device can be used to check whether there are particles on the surface of the light-emitting substrate 300. If it is found that there are particles between the second sub-connecting portion 1032B of the second conductor 103 and the first conductor 102, the laser repair equipment can be used to perform cutting and breaking processing at both ends of the second sub-connecting portion 1032B, so that the middle portion of the second sub-connecting portion 1032B is disconnected from the two ends of the second sub-connecting portion 1032B at the notches 107, so that the second sub-connecting portion 1032B will not be short circuit with the first conductor 102 due to the puncture of the particles. There are no particles under the first sub-connecting portion 1032A, and normal electrical connection can still be achieved. Therefore, the adjacent light-emitting elements 106 located on both sides of the first connecting portion 1032 can still be connected in series normally to emit light normally.

As illustrated in FIG. 7, the width of the first conductor 102 at the overlapping region R is smaller than the width of the first conductor 102 on both sides of the overlapping region R, so that the first conductor 102 illustrated in FIG. 7 has an approximate "I" shape. The first conductor 102 here may be the common voltage signal line GNDL. The light-emitting element 106 and a portion of the second conductor 103 may be provided at the position where the first conductor 102 is recessed.

As illustrated in FIG. 7, the first connecting portion 1032 of the second conductor 103 further comprises a first merging portion 1034 and a second merging portion 1035, and the first merging portion 1034 and the second merging portion 1035 are respectively located on both sides of the first conductor 102. One end of the first sub-connecting portion 1032A and one end of the second sub-connecting portion 1032B (e.g., the left ends of the first sub-connecting portion 1032A and the second sub-connecting portion 1032B in the figure) merge at the first merging portion 1034, and the other end of the first sub-connecting portion 1032A and the other end of the second sub-connecting portion 1032B (for example, the right ends of the first sub-connecting portion 1032A and the second sub-connecting portion 1032B in the figure) merge at the second merging portion 1035. The notches 107 are located near the first merging portion 1034 and the second merging portion 1035. The orthographic projections of the first merging portion 1034 and the second merging portion 1035 on the substrate 101 do not overlap with the orthographic projection of the overlapping region R on the substrate 101. In an example, the distance L between the orthographic projection of the first merging portion 1034 on the substrate 101 and the orthographic projection of the overlapping region R on the substrate 101 is greater than 300 μm, e.g. greater than 400 μm, greater than 500 μm. In addition, the orthographic projections of the first merging portion 1034 and the second merging portion 1035 on the substrate 101 do not overlap with the orthographic projection of the first insulator 104 on the substrate 101.

By making the first merging portion 1034 and the second merging portion 1035 away from the overlapping region R, it is possible to avoid the damage to the surrounding films (e.g., the first conductor 102 and the first insulator 104 located in the overlapping region R) when cutting the second sub-connecting portion 1032B with a laser to form the notches 107 near the first merging portion 1034 and the second merging portion 1035.

When the first connecting portion 1032 of the second conductor 103 comprises at least two sub-first connecting portions, that is, in the example of FIG. 5 or FIG. 6, the thickness of the portion of the first insulator 104 located in the overlapping region R in the direction perpendicular to the substrate 101 may be reduced to about 2.5 μm. As mentioned above, in the conventional light-emitting substrate 10, the entire organic insulating layer 14 usually needs to be designed to have a very thick thickness (for example, 7.5 μm~10.0 μm), the thicker organic insulating layer 14 can encapsulate the particles, to prevent the particles from penetrating through the organic insulating layer 14 to cause a short circuit between the first conductive layer 12 and the second conductive layer 13. In the light-emitting substrate 200 or 300 provided by the embodiment of the present disclosure, since the first connecting portion 1032 of the second conductor 103 comprises at least two sub-first connecting portions spaced apart from each other, such design can perfectly solve the problem of short circuit caused by particles, thus it is no longer necessary to encapsulate the particles by increasing the thickness of the first insulator 104. Compared with the organic insulating layer 14 in the related art, the first insulator 104 in the embodiments of the present disclosure can be significantly reduced not only in area and volume, but also in thickness (from 7.5 μm~10.0 μm to 2.5 μm), which is favorable for the thinning of the light-emitting substrate and the reduction of the production cost.

Figure 8:
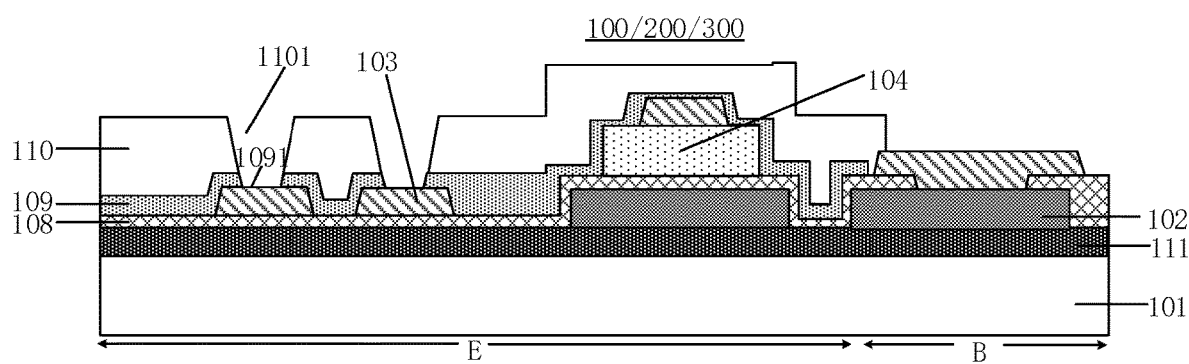
FIG. 8 is a schematic cross-sectional view of a part of a light-emitting substrate according to an embodiment of the present disclosure.

FIG. 8 illustrates a schematic cross-sectional view of a light-emitting substrate, and the light-emitting substrate may be the light-emitting substrate 100, 200, or 300 described in the previous embodiments. The same reference numbers are used to refer to the same components, therefore, for the detailed functions of the components with the same reference numerals as in the previous embodiments in FIG. 8, reference may be made to the descriptions of the light-emitting substrates 100, 200, and 300, which will not be repeated here. For example, the light-emitting substrate comprises the substrate 101, the first conductor 102, the second conductor 103, and the first insulator 104.

As illustrated in the figure, the light-emitting substrate may further comprise a second insulating layer 108, the second insulating layer 108 is located between the first conductor 102 and the second conductor 103, and the first insulator 104 is located on a side of the second insulating layer 108 away from the substrate 101. The second insulating layer 108 is an inorganic insulating layer. In an example, the material of the second insulating layer 108 is SiN. The second insulating layer 108 is disposed between the first conductor 102 and the second conductor 103, which can provide a good insulating effect for the first conductor 102 and the second conductor 103, prevent the short circuit between the first conductor 102 and the second conductor 103, and reduce the mutual capacitance between the first conductor 102 and the second conductor 103.

The shapes of the second insulating layer 108 and the first insulator 104 may be the same or different. In some embodiments, the same mask may be used to form the second insulating layer 108 and the first insulator 104 at the same time during the manufacturing process, so that both have the same shape, in this case, similar to the first insulator 104, the second insulating layer 108 is also only located in the overlapping region R, and the orthographic projection of the second insulating layer 108 on the substrate 101 covers the overlapping region R. In an alternative embodiment, during the manufacturing process, the second insulating layer 108 and the first insulator 104 may be respectively formed using masks having different patterns, so that the two have different shapes. Referring to FIG. 4 and FIG. 8, in an example, the second connecting portion 1033 of the second conductor 103 in the light-emitting region E is connected to the first conductor 102 via the second via 1081 of the second insulating layer 108. In an alternative example, the second connecting portion 1033 of the second conductor 103 in the light-emitting region E is directly connected to the first conductor 102, that is, the second connecting portion 1033 of the second conductor 103 is connected to the first conductor 102 without through any film and via. The term "A is directly connected to B" means that A and B are in direct contact. The substrate 101 comprises not only the light-emitting region E but also the bonding region B. In an example, the second connecting portion 1033 of the second conductor 103 in the light-emitting region E is directly connected to the first conductor 102, and the second conductor 103 in the bonding region B is connected to the first conductor 102 through the second via 1081 of the second insulating layer 108.

The light-emitting substrate may further comprise a third insulating layer 109 on a side of the second conductor 103 away from the substrate 101 and a fourth insulating layer 110 on a side of the third insulating layer 109 away from the substrate 101. The third insulating layer 109 comprises a third via 1091, the fourth insulating layer 110 comprises a fourth via 1101, and the third via 1091 penetrates through the fourth via 1101. The cover layer 105 (not illustrated in FIG. 8) is located on the side of the fourth insulating layer 110 away from the substrate 101. The light-emitting element 106 (not illustrated in FIG. 8) is connected to the main body 1031 of the second conductor 103 via the first opening 1051 of the cover layer 105, the third via 1091 and the fourth via 1101. The second conductor 103 comprises a plurality of conductive pads 1061 and 1062, and the orthographic projection of each conductive pad on the substrate 101 falls within the orthographic projection of the first opening 1051 of the cover layer 105 on the substrate 101. The first opening 1051 of the cover layer 105, the third via 1091 of the third insulating layer 109, and the fourth via 1101 of the fourth insulating layer 110 expose the plurality of conductive pads.

Materials of the third insulating layer 109 and the fourth insulating layer 110 may be any suitable materials, which are not limited by the embodiments of the present disclosure. The third insulating layer 109 may be an inorganic insulating layer, and the fourth insulating layer 110 may be an organic insulating layer. In an example, the third insulating layer 109 may be the same material as the second insulating layer 108, and the fourth insulating layer 110 may be the same material as the first insulator 104.

Referring back to FIG. 1B, in the conventional light-emitting substrate 10, the light-emitting substrate 10 further comprises an alignment layer 20, a second insulating layer 16, a fifth insulating layer 17, a third insulating layer 18 and a fourth insulating layer 19 that are sequentially stacked on the substrate 11. Compared with the light-emitting substrate 10, the light-emitting substrate provided by the embodiments of the present disclosure may omit the fifth insulating layer 17 and the alignment layer 20. In the light-emitting substrate 10, the fifth insulating layer 17 is used to encapsulate the particles on the one hand, and to cover the entire organic insulating layer 14 on the other hand, so as to prevent water vapor from intruding into the organic insulating layer 14. However, in the light-emitting substrate provided by the embodiment of the present disclosure, at least two sub-first connecting portions of the first connecting portion 1032 of the second conductor 103 have perfectly solved the problem of short circuit caused by particles, and the first insulator 104 is a very narrow "bridge structure" that exists only between the first connecting portion 1032 of the second conductor 103 and the first conductor 102 instead of a film with a large area. In addition, the position of the first insulator 104 avoids the openings of the light-emitting element 106 (such as the first opening 1051 of the cover layer 105, the third via 1091 of the third insulating layer 109, and the fourth via 1101 of the fourth insulating layer 110). Thus, even if water vapor enters the light-emitting substrate along these openings, it cannot contact the first insulator 104. Therefore, in the light-emitting substrate provided by the embodiments of the present disclosure, it is no longer necessary to use the fifth insulating layer 17 to encapsulate the particles and cover the first insulator 104. Therefore, the fifth insulating layer 17 can be omitted, which is beneficial to the thinning of the product and reduces the production cost. Of course, in some embodiments, the light-emitting substrate provided by the embodiments of the present disclosure may also comprise a fifth insulating layer, the fifth insulating layer is located between the second conductor 103 and the second insulating layer 108, and the fifth insulating layer covers the first insulator 104 and the second insulating layer 108. By providing the fifth insulating layer, the first insulator 104 can be better protected.

In some embodiments, the light-emitting substrate provided by the embodiments of the present disclosure may omit the alignment layer, and instead, the first conductor 102 may be used as the alignment layer during the manufacturing process. The alignment layer is usually made of a black matrix material. By omitting the alignment layer, the mask used to form the alignment layer can be saved. Alternatively, the light-emitting substrate provided by the embodiment of the present disclosure may also comprise an alignment layer 111, and the alignment layer 111 is used to provide a precise alignment function during the manufacturing process.

Figure 9:
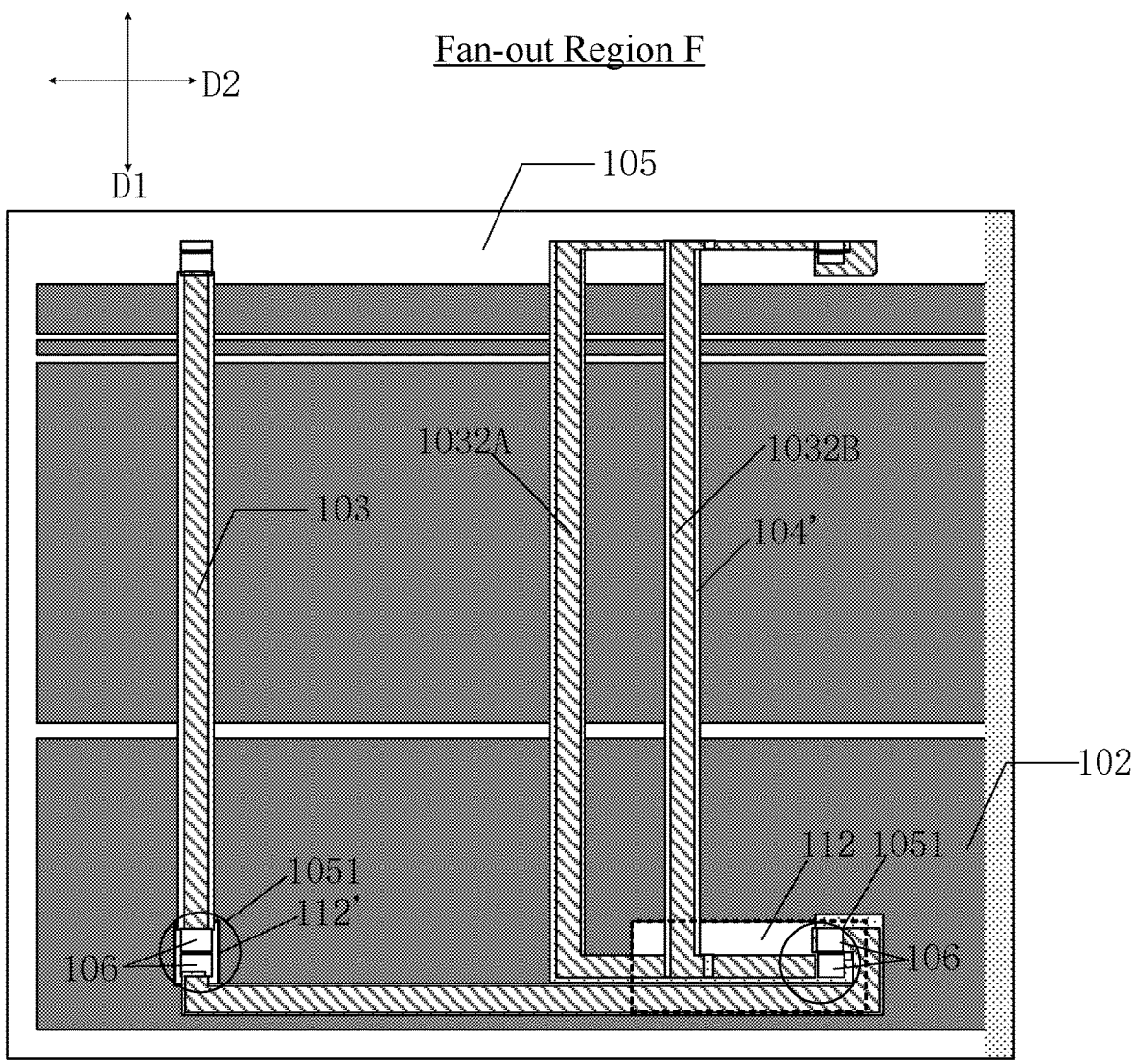
FIG. 9 is a schematic plan view of a part of a light-emitting substrate in a fan-out region according to an embodiment of the present disclosure.

FIG. 9 illustrates the wiring of the light-emitting substrate in the fan-out region F in any of the previous embodiments. In some embodiments, the fan-out region F may be a region separately arranged at the bottom of the light-emitting substrate, and the region does not overlap with the light-emitting region of the light-emitting substrate. In other embodiments, due to the requirement of a narrow frame, the fan-out region F adopts a double-layer conductive layer and partially overlaps with the light-emitting region of the light-emitting substrate. Since the wiring in the fan-out region F is complex and densely arranged, the first conductor 102 and the second conductor 103 have more overlapping regions in the fan-out region F. At the overlapping position of the first conductor 102 and the second conductor 103 in the fan-out region F, a design approach similar to that described above can be used. For example, the first connecting portion 1032 of the second conductor 103 has the "double bridges" structure, the first insulator 104 is only located at the overlapping region of the first conductor 102 and the second conductor 103, and the first opening 1051 of the cover layer 105 avoids the first insulator 104, etc. The wiring of the fan-out region F is briefly introduced below.

The wiring manner of the first conductor 102 and the second conductor 103 in the light-emitting region E and the fan-out region F is roughly as follows. Each of the first conductors 102 is not only arranged in the light-emitting region E, but also in the fan-out region F. The portion of the first conductor 102 in the light-emitting region E extends along the first direction D1, while the portion of the first conductor 102 in the fan-out region F extends either in the first direction D1, in the second direction D2, or in another direction different from the first direction D1 and the second direction D2. In other words, the first conductor 102 is bent in the fan-out region F, so as to facilitate connection with the bonding electrode of the bonding region. The main body 1031 of each second conductor 103 is connected in series with a plurality of light-emitting elements 106, for example, four light-emitting elements 106, wherein the first light-emitting element 106 of the four light-emitting elements 106 is electrically connected to the first conductor 102 via the second connecting portion 1033 of the second conductor 103, the last light-emitting element 106 of the four light-emitting elements 106 is electrically connected to the driving circuit. Each of the first conductors 102 is connected to a plurality of second conductors 103, wherein most second conductors 103 of the plurality of second conductors 103 are arranged in the light-emitting region E, and a small number of second conductors 103 among the plurality of second conductors 103 are arranged in the fan-out region F. The cover layer 105 spans the light-emitting region E and the fan-out region F of the light-emitting substrate, and the cover layer 105 comprises a first opening 1051 at the position where each light-emitting element 106 is located.

As illustrated in FIG. 9, the first conductor 102 comprises a plurality of second openings 112 in the fan-out region F (illustrated by a dotted rectangle in the figure), the number of the light-emitting elements 106 in the fan-out region F is equal to the number of the plurality of second openings 112, the orthographic projection of each light-emitting element 106 in the fan-out region F on the substrate 101 falls within the orthographic projection of the corresponding second opening 112 on the substrate 101, and the orthographic projection of a first opening 1051 of the cover layer 105 corresponding to the light-emitting element 106 on the substrate 101 falls within the orthographic projection of the corresponding second opening 112 on the substrate 101. That is to say, in the fan-out region F, at the position where the light-emitting element 106 is provided, the cover layer 105 is provided with the first opening 1051 at the corresponding position, each of the first conductors 102 is also provided with the second opening 112 at the corresponding position, and the area of the light-emitting element 106<the area of the first opening 1051<the area of the second opening 112. In the light-emitting region E, the first conductor 102 extends along the first direction D1, the first conductor 102 and the second conductor 103 have less overlapping region, the first conductor 102 does not need an opening, and the first opening 1051 of the cover layer 105 can avoid the overlapping region of the first conductor 102 and the second conductor 103. In the fan-out region F, the wiring arrangement is denser, the first conductor 102 and the second conductor 103 have more overlapping regions. If the first conductor 102 is not designed with openings, the first opening 1051 of the cover layer 105 will expose the overlapping regions of the first conductor 102 and the second conductor 103. As a result, water vapor exists in the overlapping region of the first conductor 102 and the second conductor 103 along the first opening 1051, so that electrochemical corrosion occurs, resulting in a short circuit. In FIG. 9, by making the first opening 1051 of the cover layer 105 smaller than the second opening 112 of the first conductor 102, at the position where the first opening 1051 of the cover layer 105 is located, at most only the second conductor 103 is exposed, but the first conductor 102 is not exposed. That is, at the position where the first opening 1051 of the cover layer 105 is located, there is no overlap between the first conductor 102 and the second conductor 103. In this way, electrochemical corrosion between the first conductor 102 and the second conductor 103 caused by the introduction of water vapor can be avoided.

The second opening 112 of the first conductor 102 should have an appropriate size. If the second opening 112 is too small, such as the second opening 112' illustrated in FIG. 9, the size of the first opening 1051 of the cover layer 105 is larger than that of the second opening 112' of the first conductor 102, so that the first opening 1051 of the cover layer 105 exposes the overlapping first conductor 102 and the second conductor 103. Of course, the second opening 112 should not be too large. If the opening is too large, the channel resistance of the first conductor 102 will be significantly increased.

Therefore, when designing the second opening 112 of the first conductor 102, it is necessary to first evaluate whether the increased resistance value of the first conductor 102 caused by the opening satisfies the electrical requirements. On the basis of satisfying electrical requirements, the size of the second opening 112 of the first conductor 102 is increased as much as possible.

In some embodiments, in the fan-out region F, a first insulating layer 104' may also be provided between the first conductor 102 and the second conductor 103. The shape of the first insulating layer 104' can be the same as the shape of the second conductor 103, but needs to be larger than the length and width of the second conductor 103, so that the orthographic projection of the second conductor 103 on the substrate 101 completely falls within the orthographic projection of the first insulating layer 104' on the substrate 101. With such an arrangement, the first insulating layer 104' can not only provide a good insulating effect for the first conductor 102 and the second conductor 103 in the fan-out region F, but also effectively reduce the area of the first insulating layer 104', avoid arranging the first insulating layer 104' in a large scale in the fan-out area F, and save materials. The first insulating layer 104' in the fan-out region F and the first insulator 104 in the light-emitting region E may have the same material. During the manufacturing process, the first insulator 104 and the first insulating layer 104' may be simultaneously formed by using the same mask process.

In some embodiments, in the fan-out region F, the second conductor 103 may also adopt the "double bridges" design. As illustrated in the figure, the second conductor 103 comprises a first sub-connecting portion 1032A and a second sub-connecting portion 1032B. If it is found that there are particles between one of the first sub-connecting portion 1032A and the second sub-connecting portion 1032B and the first conductor 102, a laser repairing device can be used to cut and break the two ends of the sub-connecting portion to make the middle portion of the sub-connecting portion disconnect from the two ends of the sub-connecting portion at the notches. The other one of the first sub-connecting portion 1032A and the second sub-connecting portion 1032B can still achieve normal electrical connection, so that the adjacent light-emitting elements 106 can be normally connected in series to emit light normally.

In the light-emitting substrate provided in the above embodiments, the first conductor 102 may be a driving voltage signal line VLEDL, the second conductor 103 may be a lead connecting the light-emitting elements 106. The first conductor 102 is electrically connected to the second connecting portion 1033 of the second conductor 103 to transmit a driving voltage signal to the light-emitting element 106, thereby driving the light-emitting element 106 to emit light. Other wire arrangements are not illustrated in the drawings. In fact, there are several other leads located on the same layer as the first conductor 102, such as the common voltage signal line GNDL, the address selection signal line ADDRL, the power signal line VccL, the driving data signal line DataL, the feedback signal line FBL, etc. During the manufacturing process, the first conductor 102 and the above-mentioned several leads may be formed simultaneously by patterning the same conductive layer. Similarly, there are other components located on the same layer as the second conductor 103, such as the conductive pads of the light-emitting element 106 and the conductive pads of the driving circuit, and the like. During the manufacturing process, the second conductor 103 and the above-mentioned components may be formed simultaneously by patterning the same conductive layer.

Figure 10:
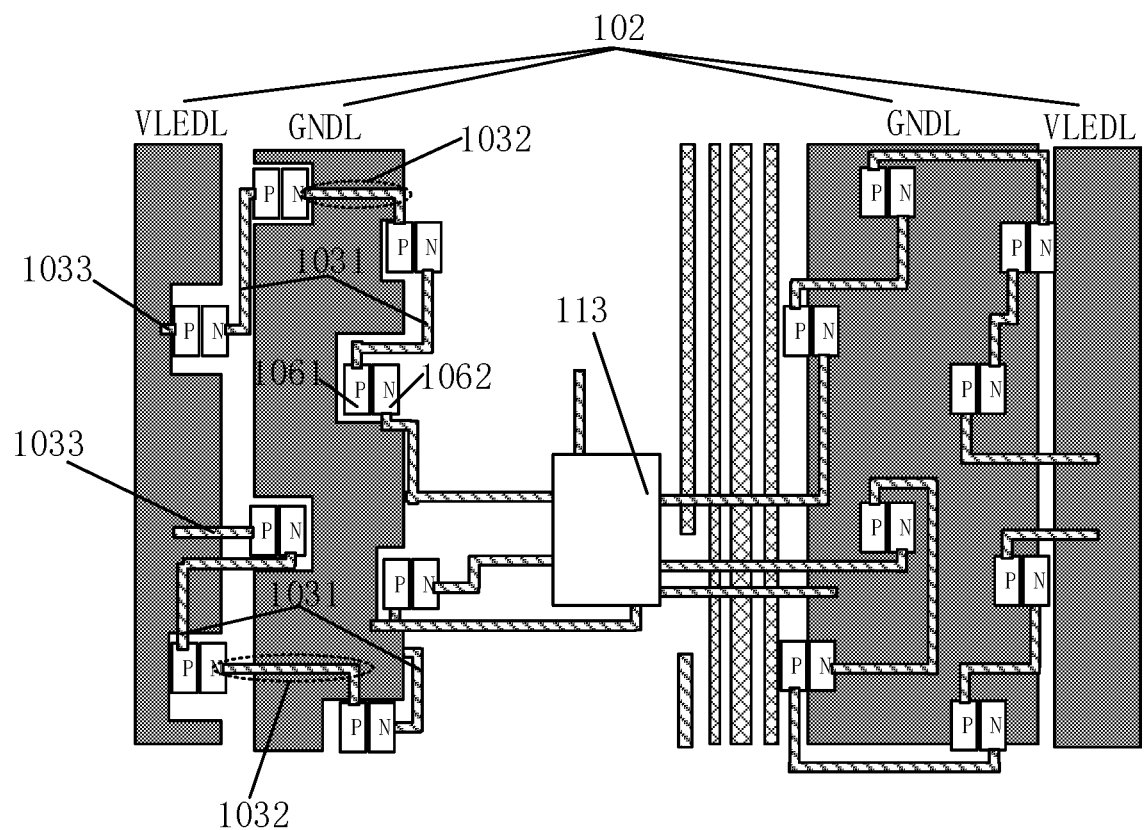
FIG. 10 is a schematic plan view of a part of a light-emitting substrate according to an embodiment of the present disclosure.

FIG. 10 illustrates a schematic plan view of a partial structure of a light-emitting substrate according to an embodiment of the present disclosure. The light-emitting substrate illustrated in FIG. 10 may be the light-emitting substrate 100, 200, or 300 described in the previous embodiments. As illustrated in FIG. 10, the first conductor 102 comprises a driving voltage signal line VLEDL and a common voltage signal line GNDL. The second connecting portion 1033 of the second conductor 103 is electrically connected to the driving voltage signal line VLEDL to receive the voltage signal from the driving voltage signal line VLEDL. The first connecting portion 1032 of the second conductor 103 overlaps with the common voltage signal line GNDL to form the overlapping region R as described above, the main body 1031 of the second conductor 103 has four light-emitting elements connected in series, and each light-emitting element is connected to the first pad 1061 and the second pad 1062. The light-emitting substrate also comprises an integrated circuit 113. During the light emission period, the integrated circuit 113 supplies a driving voltage to the driving voltage signal line VLEDL and a common voltage to the common voltage signal line GNDL, thereby driving the light-emitting element to emit light. For the specific working principle of the integrated circuit 113, reference may be made to the contents recorded in the relevant documents, and the embodiments of the present disclosure will not be repeated here.

According to another aspect of the present disclosure, there is provided a backlight comprising the light-emitting substrate described in any of the preceding embodiments. The backlight can be used as a backlight in a display device to provide a display light source for a display panel in the display device. Of course, the backlight may also be used in any other device that requires a light source, and the embodiments of the present disclosure do not specifically limit the use of the backlight. Since the backlight can have substantially the same technical effect as the light-emitting substrate described in the previous embodiments, for the sake of brevity, the description of the technical effect of the backlight will not be repeated here.

Figure 11:
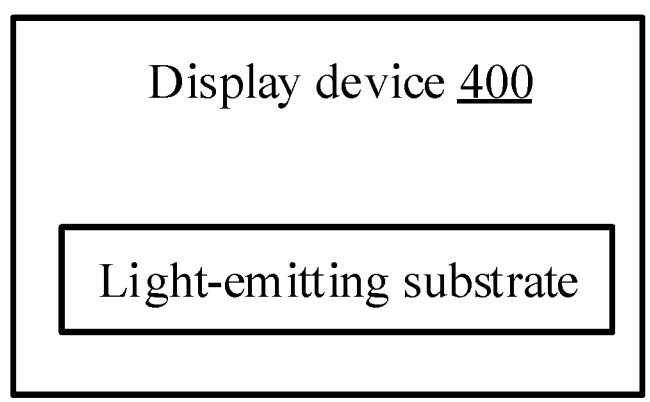
FIG. 11 is a block diagram of a display device according to an embodiment of the present disclosure.

According to yet another aspect of the present disclosure, a display device is provided, and FIG. 11 illustrates a block diagram of a display device 400 comprising the light-emitting substrate described in any of the foregoing embodiments. In some embodiments, the display device 400 may be a liquid crystal display device, which comprises a liquid crystal panel and a backlight disposed on a non-display side of the liquid crystal panel, the backlight comprising the light-emitting substrate described in any of the previous embodiments, for example can be used to implement HDR dimming for display. The liquid crystal display device can have more uniform backlight brightness and better display contrast. The display device 400 can be any suitable display device, including but not limited to any product or component with display function, such as a mobile phone, a tablet computer, a television, a monitor, a notebook computer, a digital photo frame, a navigator, an e-book, and the like.

Since the display device 400 may have substantially the same technical effects as the light-emitting substrates described in the previous embodiments, for the sake of brevity, the technical effects of the display device 400 will not be described here.

Figure 12:
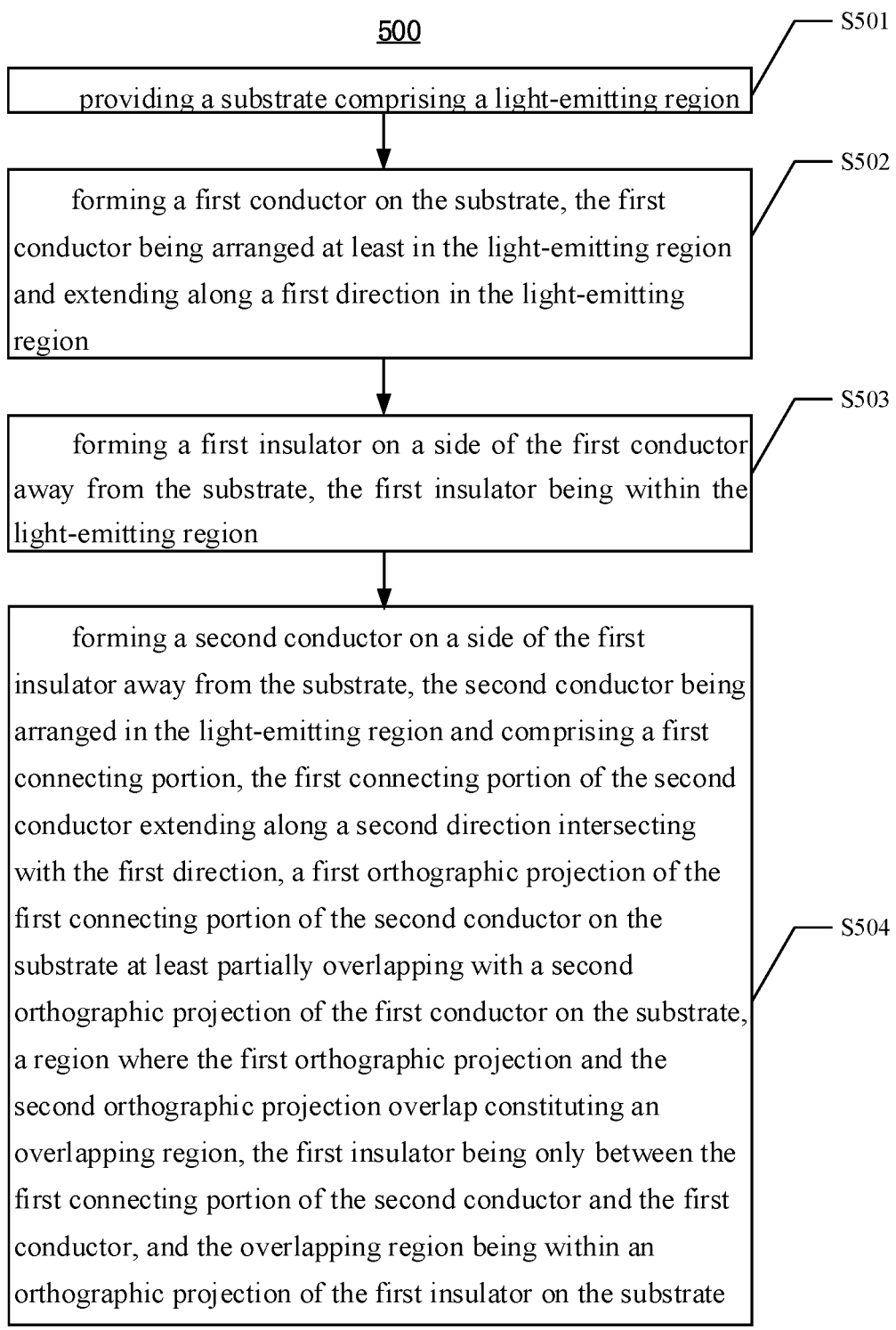
FIG. 12 is a flowchart of a method for manufacturing a light-emitting substrate according to an embodiment of the present disclosure.

According to still another aspect of the present disclosure, a method for manufacturing a light-emitting substrate is provided, and FIG. 12 illustrates a flowchart of the method 500, which is applicable to the light-emitting substrate described in any one of the foregoing embodiments. Method 500 may comprise the following steps:

S501: providing a substrate 101 comprising a light-emitting region E;

S502: forming a first conductor 102 on the substrate 101, the first conductor 102 being arranged at least in the light-emitting region E and extending along a first direction D1 in the light-emitting region E;

S503: forming a first insulator 104 on a side of the first conductor 102 away from the substrate 101, the first insulator 104 being within the light-emitting region E; and S504: forming a second conductor 103 on a side of the first insulator 104 away from the substrate 101, the second conductor 103 being arranged in the light-emitting region E and comprising a first connecting portion 1032, the first connecting portion 1032 of the second conductor 103 extending along a second direction D2 intersecting with the first direction D1, a first orthographic projection of the first connecting portion 1032 of the second conductor 103 on the substrate 101 at least partially overlapping with a second orthographic projection of the first conductor 102 on the substrate 101, a region where the first orthographic projection and the second orthographic projection overlap constituting an overlapping region R, the first insulator 104 being only between the first connecting portion 1032 of the second conductor 103 and the first conductor 102, and the overlapping region R being within an orthographic projection of the first insulator 104 on the substrate 101.

The steps of the method 500 are described in more detail below with reference to FIGS. 6 to 9 with an example.

First, the substrate 101 is provided. The substrate 101 may be any suitable substrate such as a plastic substrate, a silicon substrate, a ceramic substrate, a glass substrate, a quartz substrate, etc. The embodiment of the present disclosure does not limit the material of the substrate 101.

Then, a first conductive layer is applied on the substrate 101, and the first conductive layer is patterned through a first mask process to form the first conductor 102. The first conductive layer may be formed on the substrate 101 by a magnetron sputtering method or an electroplating method. The first conductor 102 spans the light-emitting region E and the fan-out region F, and the first conductor 102 extends in the light-emitting region E along the first direction D1. The portion of the first conductor 102 in the fan-out region F comprises a second opening 112 at a position corresponding to the light-emitting element 106. The first conductor 102 may be, for example, a driving voltage signal line VLEDL. When the first conductor 102 is formed by the magnetron sputtering method, since the thickness of a single magnetron sputtering generally does not exceed 1 μm, when a conductive layer with a thickness exceeding 1 μm is formed, multiple times of sputtering are usually required. In an example, the formation process of the first conductor 102 can be expressed as follows: first, a MoNb layer with a thickness of about 300 Å is formed on the substrate 101, and the MoNb layer is used to improve the adhesion between the film and the substrate 101; then a Cu layer with a thickness of about 3.6 μm is formed on the MoNb layer to transmit various electrical signals; finally, a MoNb layer with a thickness of about 300 Å is formed on the Cu layer to protect the intermediate Cu layer and prevent the surface of the intermediate Cu layer with low resistivity from being exposed and oxidized. In an alternative example, the formation process of the first conductor 102 can be expressed as follows: first, a molybdenum-titanium-nickel (MTD) layer with a thickness of about 300 Å is formed on the substrate 101; then a Cu layer with a thickness of about 3.6 μm is formed on the molybdenum-titanium-nickel layer to transmit various electrical signals; finally, a molybdenum-titanium-nickel layer or an alloy (such as CuNi) layer with a thickness of about 300 Å is formed on the Cu layer to protect the intermediate Cu layer and prevent the surface of the intermediate Cu layer with low resistivity from being exposed and oxidized. In other embodiments, when the first conductor 102 is formed on the substrate 101 by an electroplating method, a seed layer can be formed by using MoNiTi first, so as to increase the nucleation density of metal grains in the subsequent electroplating process, and then a Cu layer with low resistivity is formed by electroplating, and then an anti-oxidation layer is formed, the material may be MoNiTi. When the first conductor 102 is formed by the first mask process, other signal lines such as the common voltage signal line GNDL, the address selection signal line ADDRL, the power signal line VccL, the data driving signal line DataL, and the feedback signal line FBL can also be formed at the same time.

Next, a second insulating material layer is applied on a side of the first conductor 102 away from the substrate 101 by a method of magnetron sputtering and a first insulating material layer is applied on a side of the second insulating material layer away from the substrate 101, the first insulating material layer and the second insulating material layer are patterned by a second mask process to form the first insulator 104 and the second insulating layer 108. The shape of the first insulator 104 and the second insulating layer 108 are the same, the thickness of the portion of the first insulator 104 in the overlapping region R may be about 2.5 μm, and the thickness of the second insulating layer 108 may be about 2400 Å, for example. The first insulator 104 is only located between the first conductor 102 and the first connecting portion 1032 of the second conductor 103 which will be formed subsequently. The first insulator 104 and the second insulating layer 108 have appropriate thicknesses. On the one hand, they can be used to encapsulate the particles between the first conductor 102 and the second conductor 103 to prevent the first conductor 102 and the second conductor 103 from short circuit due to being penetrated by the particles; on the other hand, the first conductor 102 and the second conductor 103 can have an appropriate separation distance, so as to prevent an obvious mutual capacitance between the first conductor 102 and the second conductor 103. The material of the first insulator 104 may be an organic material, such as negative photoresist. The material of the second insulating layer 108 may be an inorganic material, such as SiN.

Then, a second conductive layer is formed on a side of the second insulating layer 108 away from the substrate 101 by the magnetron sputtering method or the electroplating method, and the second conductive layer is patterned by a third mask process to form a second conductor 103. The second conductor 103 comprises a main body 1031, a first connecting portion 1032 and a second connecting portion 1033 connected to the main body 1031. The main body 1031 of the second conductor 103 is configured to be electrically connected to the light-emitting element 106, the second connecting portion 1033 of the second conductor 103 is configured to be electrically connected to the first conductor 102, and the main body 1031 is located on both sides of the first connecting portion 1032 and is connected to both ends of the first connecting portion 1032 respectively. Therefore, the light-emitting elements 106 on the main body 1031 on both sides of the first connecting portion 1032 can be connected in series through the first connecting portion 1032. The signal of the first conductor 102 can be transmitted to a plurality of light-emitting elements 106 connected in series through the second conductor 103. The second conductor 103 exhibits a similar "U-shaped" structure. The first connecting portion 1032 of the second conductor 103 comprises at least two sub-first connecting portions 1032A and 1032B extending along the second direction D2 and spaced apart from each other, and the interval between the at least two sub-first connecting portions 1032A and 1032B is greater than 300 μm. The first insulator 104 is disposed between the first connecting portion 1032 of the second conductor 103 and the first conductor 102 to electrically insulate the first connecting portion 1032 of the second conductor 103 from the first conductor 102. When the second conductor 103 is formed by the magnetron sputtering method, since the thickness of a single magnetron sputtering generally does not exceed 1 μm, when a conductive layer with a thickness exceeding 1 μm is formed, multiple times of sputtering are usually required. In an example, the formation process of the second conductor 103 can be expressed as follows: first, a MoNb layer with a thickness of about 300 Å is formed on the second insulating layer 108, and the MoNb layer is used to improve the adhesion between the film and the second insulating layer 108; then a Cu1 layer with a thickness of about 0.6 μm is formed on the MoNb layer; finally a Cu2 layer with a thickness of about 500 Å is formed on the Cu1 layer to protect the intermediate Cu1 layer and prevent the surface of the intermediate Cu1 layer with low resistivity from being exposed and oxidized. In another example, the formation process of the second conductor 103 can be expressed as follows: first, a molybdenum-titanium-nickel (MTD) layer with a thickness of about 300 Å is formed on the second insulating layer 108; then a Cu layer with a thickness of about 0.6 μm is formed on the molybdenum-titanium-nickel layer; finally a CuNi alloy layer with a thickness of about 500 Å is formed on the Cu layer to protect the intermediate Cu layer and prevent the surface of the intermediate Cu layer with low resistivity from being exposed and oxidized. When the second conductor 103 is formed by using the third mask process, for example, a first conductive pad and a second conductive pad can also be formed at the same time. The first conductive pad is used for mounting the light-emitting element 106, and the second conductive pad is used for mounting the driving circuit.

Then, a third insulating material layer is applied on a side of the second conductor 103 away from the substrate 101 and a fourth insulating material layer is applied on a side of the third insulating material layer away from the substrate 101. The third insulating material layer and the fourth insulating material layer are patterned through a fourth mask process to form a third insulating layer 109 and a fourth insulating layer 110. The third insulating layer 109 comprises a third via 1091, and the fourth insulating layer 110 comprises a fourth via 1101. The thickness of the third insulating layer 109 may be, for example, about 3500 Å, and the thickness of the fourth insulating layer 110 may be, for example, about 3.0 µm. The material of the third insulating layer 109 may be an inorganic material such as SiN. The material of the fourth insulating layer 110 may be an organic material, such as negative photoresist.

Next, after the third insulating layer 109 and the fourth insulating layer 110 are prepared, or after the second conductor 103 is prepared and before the third insulating layer 109 and the fourth insulating layer 110 are prepared, the all-in-one (AIO) device is used to check whether there are particles on the surface of the light-emitting substrate. If it is found that there are particles between one of the first sub-connecting portion 1032A and the second sub-connecting portion 1032B of the second conductor 103 and the first conductor 102, a laser repair equipment can be used to cut and break the two ends of the sub-connecting portion, so that the middle portion of the sub-connecting portion is disconnected from the two ends of the sub-connecting portion at the notches 107, therefore, the sub-connecting portion will not be short circuit with the first conductor 102 due to the puncture of the particles. There are no particles under the other one of the first sub-connecting portion 1032A and the second sub-connecting portion 1032B, and normal electrical connection can still be achieved, so that the adjacent light-emitting elements 106 can be normally connected in series to emit light normally.

Then, a cover layer 105 is formed on a side of the fourth insulating layer 110 away from the substrate 101 by a screen printing method The cover layer 105 covers at least the light-emitting region E and the fan-out region F, and comprises a plurality of first openings 1051 in the light-emitting region E and the fan-out region F. The position of each first opening 1051 corresponds to the position of each light-emitting element 106 to allow the light-emitting element 106 to be connected to the main body 1031 of the second conductor 103 via the first opening 1051. In the light-emitting region E, the orthographic projection of the first opening 1051 of the cover layer 105 on the substrate 101 does not overlap with the orthographic projection of the second connecting portion 1033 of the second conductor 103 on the substrate 101, and the orthographic projection of the first opening 1051 of the cover layer 105 on the substrate 101 does not overlap with the orthographic projection of the first insulator 104 on the substrate 101. In the fan-out region F, the position of each first opening 1051 corresponds to the position of each second opening 112 of the first conductor 102, and the orthographic projection of the first opening 1051 of the cover layer 105 on the substrate 101 falls within the orthographic projection of the second opening 112 of the first conductor 102 on the substrate 101.

Finally, the light-emitting element 106 is mounted on a side of the cover layer 105 away from the substrate 101. The light-emitting element 106 is electrically connected to the main body 1031 of the second conductor 103 through the first opening 1051 of the cover layer 105 and the fourth via 1101 of the fourth insulating layer 110 and the third via 1091 of the third insulating layer 109.

It can be seen from the above description that in the method 500 provided by the embodiment of the present disclosure, the light-emitting substrate can be prepared through four mask processes, that is, using four masks. Compared with the related art requiring at least seven masks to complete the preparation, the method 500 provided by the embodiment of the present disclosure omits three rounds of mask processes and saves three masks, thereby significantly improving production efficiency and reducing production costs. For other technical effects achieved by the method 500 provided in this embodiment of the present disclosure, reference may be made to the technical effects of the light-emitting substrate described in the previous embodiments, and therefore, for the sake of brevity, the description is not repeated here.

In some embodiments, after forming the first insulator 104 and the second insulating layer 108 and before forming the second conductor 103, the method may further comprise: applying a fifth insulating material layer on the side of the second insulating layer 108 away from the substrate 101 to cover the first insulator 104 and the second insulating layer 108, patterning the fifth insulating material layer through a fifth mask process to form a fifth insulating layer, which is over the second insulating layer 108 and the first insulator 104. The thickness of the fifth insulating layer may be, for example, about 1500 Å. By providing the fifth insulating layer, the first insulator 104 can be better protected, and potential water vapor can be prevented from entering the first insulator 104. The material of the fifth insulating layer may be an inorganic material such as SiN.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed above could be termed a second element, component, region, layer or section without departing from the teachings of the present disclosure.

Spatially relative terms such as "row", "column", "below", "above", "left", "right", etc. may be used herein for ease of description to describe factors such as the relationship of one element or feature to another element or feature (s) illustrated in the figures. It will be understood that these spatially relative terms are intended to encompass different orientations of the device in use or operation in addition to the orientation depicted in the figures. For example, if the device in the figures is turned over, elements described as "below" other elements or features would then be oriented "above" other elements or features. Thus, the exemplary term "below" can encompass both an orientation of above and below. The device may be otherwise oriented (rotated 90 degrees or at other orientations) and the spatially relative descriptors used herein are interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to limit the present disclosure. As used herein, the singular forms "a," "an," and "the" are intended to comprise the plural forms as well, unless the context clearly dictates otherwise. It will be further understood that the terms "comprise" and/or "include" when used in this specification designate the presence of stated features, integers, steps, operations, elements and/or parts, but do not exclude the presence or addition of one or more other features, integers, steps, operations, elements, components and/or groups thereof. As used herein, the term "and/or" comprises any and all combinations of one or more of the associated listed items. In the description of this specification, description with reference to the terms "one embodiment," "another embodiment," etc. means that a particular feature, structure, material, or characteristic described in connection with the embodiment is included in at least one embodiment of the present disclosure. In this specification, schematic representations of the above terms are not necessarily directed to the same embodiment or example. Furthermore, the particular features, structures, materials or characteristics described may be combined in any suitable manner in any one or more embodiments or examples. Furthermore, those skilled in the art may combine the different embodiments or examples as well as the features of the different embodiments or examples described in this specification without conflicting each other.

It will be understood that when an element or layer is referred to as being "on", "connected to", "coupled to", or "adjacent to" another element or layer, it may be directly on, directly connected to, directly coupled to, or directly adjacent to another element or layer, or intervening elements or layers may be present. In contrast, when an element is referred to as being "directly on", "directly connected to", "directly coupled to", "directly adjacent to" another element or layer, with no intervening elements or layers present. However, in no case should "on" or "directly on" be interpreted as requiring a layer to completely cover the layer below.

Embodiments of the disclosure are described herein with reference to schematic illustrations (and intermediate structures) of idealized embodiments of the disclosure. As such, variations to the shapes of the illustrations are to be expected, e.g., as a result of manufacturing techniques and/or tolerances. Accordingly, embodiments of the present disclosure should not be construed as limited to the particular shapes of the regions illustrated herein, but are to comprise deviations in shapes due, for example, to manufacturing. Thus, the regions illustrated in the figures are schematic in nature and their shapes are not intended to illustrate the actual shape of a region of a device and are not intended to limit the scope of the present disclosure.

Unless otherwise defined, all terms (comprising technical and scientific terms) used herein have the same meaning as commonly understood by one of ordinary skill in the art to which this disclosure belongs. It will be further understood that terms such as those defined in commonly used dictionaries should be construed to have meanings consistent with their meanings in the relevant art and/or the context of this specification, and will not be idealized or overly interpreted in a formal sense, unless expressly defined as such herein.

The above descriptions are merely specific embodiments of the present disclosure, but the protection scope of the present disclosure is not limited thereto. Any person skilled in the art can easily think of changes or substitutions within the technical scope disclosed by the present disclosure, which should be comprised within the protection scope of the present disclosure. Therefore, the protection scope of the present disclosure should be based on the protection scope of the claims.

The invention claimed is:

1. A light-emitting substrate comprising:
a substrate comprising a light-emitting region;
a first conductor on the substrate and arranged at least in the light-emitting region, the first conductor extending along a first direction in the light-emitting region;
a second conductor on a side of the first conductor away from the substrate and arranged in the light-emitting region, the second conductor comprising a first connecting portion;
a first insulator within the light-emitting region; and
a cover layer on a side of the second conductor away from the substrate,
wherein the first connecting portion of the second conductor extends along a second direction intersecting with the first direction, a first orthographic projection of the first connecting portion of the second conductor on the substrate at least partially overlaps with a second orthographic projection of the first conductor on the substrate, a region where the first orthographic projection and the second orthographic projection overlap comprises an overlapping region,
wherein the first insulator is only between the first connecting portion of the second conductor and the first conductor, and the overlapping region is within an orthographic projection of the first insulator on the substrate, and
wherein the cover layer comprises a plurality of first openings, and an orthographic projection of the plurality of first openings of the cover layer on the substrate do not overlap with the orthographic projection of the first insulator on the substrate.

2. The light-emitting substrate according to claim 1, wherein an orthographic projection of a portion of each of two sides of the first conductor extending along the first direction on the substrate is within the orthographic projection of the first insulator on the substrate, the portion of each of two sides of the first conductor is in the overlapping region, and
wherein an orthographic projection of a portion of each of two sides of the first connecting portion of the second conductor extending along the second direction on the substrate is within the orthographic projection of the first insulator on the substrate, the portion of each of two sides of the first connecting portion of the second conductor is in the overlapping region.

3. The light-emitting substrate according to claim 1, wherein a ratio of an area of the orthographic projection of the first insulator on the substrate to an area of the substrate is approximately 10%.

4. The light-emitting substrate according to claim 1, wherein an area of the orthographic projection of the first insulator on the substrate is smaller than an area of an orthographic projection of the second conductor on the substrate.

5. The light-emitting substrate according to claim 1, wherein the first connecting portion of the second conductor comprises at least two sub-first connecting portions extending along the second direction and spaced apart from each other, and wherein orthographic projections of the at least two sub-first connecting portions on the substrate at least partially overlap with the orthographic projection of the same first insulator on the substrate.

6. The light-emitting substrate according to claim 5, wherein an interval between two adjacent sub-first connecting portions among the at least two sub-first connecting portions is greater than 300 μm.

7. The light-emitting substrate according to claim 5, wherein the first connecting portion of the second conductor further comprises a first merging portion and a second merging portion, the first merging portion and the second merging portion are respectively on both sides of the first conductor, two ends of the at least two sub-first connecting portions respectively merge at the first merging portion and the second merging portion, and orthographic projections of the first merging portion and the second merging portion on the substrate do not overlap with an orthographic projection of the overlapping region on the substrate.

8. The light-emitting substrate according to claim 5, wherein one of the at least two sub-first connecting portions comprises two notches, the two notches are respectively on both sides of the first conductor, and a middle portion of the sub-first connecting portion is disconnected from two ends of the sub-first connecting portion at the two notches.

9. The light-emitting substrate according to claim 5, wherein the same first insulator comprises at least two sub-insulators extending along the second direction and spaced apart from each other, a number of the sub-insulators is equal to a number of the sub-first connecting portions, and an orthographic projection of each of the sub-first connecting portions on the substrate at least partially overlaps with an orthographic projection of the corresponding one of the sub-insulators on the substrate.

10. The light-emitting substrate according to claim 1, wherein a material of the first insulator is an organic material.

11. The light-emitting substrate according to claim 1, wherein a thickness of a portion of the first insulator in the overlapping region in a thickness direction of the substrate is about 2.5 μm.

12. The light-emitting substrate according to claim 1, wherein the second conductor further comprises a second connecting portion, and the second connecting portion of the second conductor is electrically connected to the first conductor, and
wherein the orthographic projection of the plurality of first openings of the cover layer on the substrate does not overlap with an orthographic projection of the second connecting portion of the second conductor on the substrate.

13. The light-emitting substrate according to claim 12, further comprising:
a second insulating layer,
wherein the second insulating layer is between the first conductor and the second conductor, and the first insulator is on a side of the second insulating layer away from the substrate.

14. The light-emitting substrate according to claim 13, wherein the second connecting portion of the second conductor is connected to the first conductor through a second via in the second insulating layer.

15. The light-emitting substrate according to claim 13, wherein the second insulating layer is only at the overlapping region.

16. The light-emitting substrate according to claim 1, wherein the second conductor further comprises a plurality of conductive pads, and an orthographic projection of each of the plurality of first openings of the cover layer on the substrate covers an orthographic projection of at least one of the plurality of conductive pads on the substrate.

17. The light-emitting substrate according to claim 16, further comprising:
a third insulating layer between the second conductor and the cover layer and comprising a plurality of third vias; and
a fourth insulating layer between the third insulating layer and the cover layer and comprising a plurality of fourth vias,
wherein each of the plurality of third vias penetrates a corresponding one of the plurality of fourth vias, and the plurality of third vias and the plurality of fourth vias expose the plurality of conductive pads.

18. The light-emitting substrate according to claim 13, further comprising:
a fifth insulating layer between the second conductor and the second insulating layer,
wherein the fifth insulating layer covers the first insulator and the second insulating layer.

19. The light-emitting substrate according to claim 12, wherein the second conductor further comprises a main body, the main body is on both sides of the first connecting portion, a first end of the main body on one side of the first connecting portion is connected with a first end of the first connecting portion, a second end of the main body on the one side of the first connecting portion is connected with the second connecting portion, and a first end of the main body on the other side of the first connecting portion is connected with a second end of the first connecting portion.

20. The light-emitting substrate according to claim 1, further comprising:
a plurality of light-emitting elements,
wherein each of the plurality of light-emitting elements is a mini light-emitting diode or a micro light-emitting diode.

21. The light-emitting substrate according to claim 1, wherein there is a voltage difference between the first conductor and the second conductor.

22. A display device comprising the light-emitting substrate according to claim 1.

23. A method for manufacturing a light-emitting substrate, comprising:
providing a substrate comprising a light-emitting region;
forming a first conductor on the substrate, the first conductor being arranged at least in the light-emitting region and extending along a first direction in the light-emitting region;
forming a first insulator on a side of the first conductor away from the substrate, the first insulator being within the light-emitting region;
forming a second conductor on a side of the first insulator away from the substrate, the second conductor being arranged in the light-emitting region and comprising a first connecting portion, the first connecting portion of the second conductor extending along a second direction intersecting with the first direction, a first orthographic projection of the first connecting portion of the second conductor on the substrate at least partially overlapping with a second orthographic projection of the first conductor on the substrate, a region where the first orthographic projection and the second orthographic projection overlap comprising an overlapping region, the first insulator being only between the first connecting portion of the second conductor and the first conductor, and the overlapping region being within an orthographic projection of the first insulator on the substrate; and forming a cover layer on a side of the second conductor away from the substrate, the cover layer comprising a plurality of first openings, an orthographic projection of the plurality of first openings of the cover layer on the substrate not overlapping with the orthographic projection of the first insulator on the substrate.

24. The method according to claim 23, wherein the forming the first conductor, the first insulator and the second conductor comprises:

applying a first conductive layer on the substrate, patterning the first conductive layer through a first mask process to form the first conductor;

applying a second insulating material layer on a side of the first conductor away from the substrate and applying a first insulating material layer on a side of the second insulating material layer away from the substrate, patterning the first insulating material layer and the second insulating material layer through a second mask process to form the first insulator and a second insulating layer;

applying a second conductive layer on a side of the first insulator and the second insulating layer away from the substrate, patterning the second conductive layer through a third mask process to form the second conductor; and applying a third insulating material layer on a side of the second conductor away from the substrate and applying a fourth insulating material layer on a side of the third insulating material layer away from the substrate, patterning the third insulating material layer and the fourth insulating material layer through a fourth mask process to form a third insulating layer and a fourth insulating layer.

25. The method according to claim 24, after forming the first insulator and the second insulating layer and before forming the second conductor, further comprising:

applying a fifth insulating material layer on a side of the second insulating layer away from the substrate to cover the first insulator and the second insulating layer; and patterning the fifth insulating material layer through a fifth mask process to form a fifth insulating layer.

26. The method according to claim 24, wherein the forming the second conductor further comprises:

patterning the second conductive layer through the third mask process, such that the first connecting portion of the second conductor comprises at least two sub-first connecting portions extending along the second direction and spaced apart from each other, and in response to detecting fault of one of the at least two sub-first connecting portions, using a laser to cut both sides of the faulty sub-first connecting portion, so that a middle portion and two ends of the faulty sub-first connecting portion are disconnected.

* * * * *